US008572454B1

(12) United States Patent
Yeo et al.

(10) Patent No.: US 8,572,454 B1
(45) Date of Patent: Oct. 29, 2013

(54) SYSTEM AND METHOD FOR DECODING CORRELATED DATA

(71) Applicant: Marvell International Ltd., Hamilton (BM)

(72) Inventors: Engling Yeo, San Jose, CA (US); Panu Chaichanavong, Bangkok (TH)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 13/684,895

(22) Filed: Nov. 26, 2012

Related U.S. Application Data

(63) Continuation of application No. 13/470,495, filed on May 14, 2012, now Pat. No. 8,321,749, which is a continuation of application No. 12/323,995, filed on Nov. 26, 2008, now Pat. No. 8,181,081.

(60) Provisional application No. 60/991,502, filed on Nov. 30, 2007.

(51) Int. Cl.
*G06F 11/00* (2006.01)

(52) U.S. Cl.
USPC .......................................................... 714/752

(58) Field of Classification Search
USPC ......................................... 714/752, 786, 795
See application file for complete search history.

(56) References Cited

U.S. PATENT DOCUMENTS

| | | | |
|---|---|---|---|
| 6,539,367 B1 | 3/2003 | Blanksby et al. | |
| 6,633,856 B2 | 10/2003 | Richardson et al. | |
| 6,640,228 B1 | 10/2003 | Handerson et al. | |
| 6,789,227 B2 | 9/2004 | De Souza et al. | |
| 6,895,547 B2 | 5/2005 | Eleftheriou et al. | |
| 7,017,106 B2 | 3/2006 | Shen et al. | |
| 7,127,659 B2 | 10/2006 | Richardson et al. | |
| 7,154,936 B2 | 12/2006 | Bjerke et al. | |
| 7,184,486 B1 | 2/2007 | Wu et al. | |
| 7,590,920 B2 | 9/2009 | Yang et al. | |
| 7,594,161 B2 | 9/2009 | Lestable | |
| 7,751,505 B1 | 7/2010 | Wu et al. | |
| 7,962,830 B2 | 6/2011 | Eroz et al. | |
| 8,028,216 B1 | 9/2011 | Yeo et al. | |
| 2003/0014718 A1 | 1/2003 | De Souza et al. | |
| 2003/0061563 A1 | 3/2003 | Venkataraman et al. | |
| 2004/0034828 A1 | 2/2004 | Hocevar | |
| 2004/0210812 A1 | 10/2004 | Cameron et al. | |
| 2004/0240590 A1 | 12/2004 | Cameron et al. | |
| 2005/0129147 A1 | 6/2005 | Cannon et al. | |

(Continued)

OTHER PUBLICATIONS 802.11 n; IEEE P802.11-04/0889r6; Wireless LANs, TGn Sync Proposal Technical Specification; May 2005; 131 pages.

(Continued)

*Primary Examiner* — Marc Duncan

(57) ABSTRACT

A communication system includes an encoder configured to encode first data words to generate code words. A modulator is configured to modulate the code words into a first signal that is transmitted on a communication channel. A demodulator is configured to demodulate a second signal, received from the communication channel, into estimates of the code words. The second signal is based on the first signal. A decoding module is configured to group the estimates of the code words into a plurality of groups of correlated data bits, wherein the correlated data bits include statistical relationships between different data bits, generate a plurality of group estimate signals each corresponding to a respective one of the plurality of groups of correlated data bits, and generate, by combining the plurality of group estimate signals, an estimate signal corresponding to the first data words.

16 Claims, 15 Drawing Sheets

(56) References Cited

U.S. PATENT DOCUMENTS

| | | |
|---|---|---|
| 2005/0160351 A1 | 7/2005 | Ko et al. |
| 2005/0265387 A1 | 12/2005 | Khojastepour et al. |
| 2005/0283709 A1 | 12/2005 | Kyung et al. |
| 2006/0026486 A1 | 2/2006 | Richardson et al. |
| 2006/0107193 A1 | 5/2006 | Park et al. |
| 2006/0156163 A1 | 7/2006 | Berens et al. |
| 2006/0156169 A1 | 7/2006 | Shen et al. |
| 2007/0043997 A1 | 2/2007 | Yang et al. |
| 2007/0044006 A1 | 2/2007 | Yang et al. |
| 2008/0098287 A1 | 4/2008 | Kolze et al. |
| 2008/0178063 A1 | 7/2008 | Norris et al. |
| 2010/0100789 A1 | 4/2010 | Yu et al. |
| 2010/0122143 A1 | 5/2010 | Lee et al. |
| 2010/0235706 A1 | 9/2010 | Eberlein et al. |

OTHER PUBLICATIONS

ANSI/IEEE Std 802.11, 1999 Edition; Information technology—Telecommunications and information exchange between systems—Local and metropolitan area networks—Specific requirements—Part 11: Wireless LAN Medium Access Control (MAC) and Physical Layer (PHY) Specifications; LAN/MAN Standards Committee of the IEEE Computer Society; 528 pages.

Forney, Jr., G. David, Codes on Graphs: Normal Realizations, IEEE Transactions on Information Theory, 47:2, Feb. 2001, pp. 520-548.

IEEE 802.20-PD-06, IEEE P 802.20 V14, Jul. 16, 2004, Draft 802.20 Permanent Document, System Requirements for IEEE 802.20 Mobile Broadband Wireless Access Systems—Version 14, 23 pages.

IEEE P802.11g/D8.2, Apr. 2003 (Supplement to ANSI/IEEE Std 802.11-1999(Reaff 2003)); DRAFT Supplement to STANDARD [for] Information Technology—Telecommunications and information exchange between systems—Local and metropolitan area networks—Specific requirements—Part 11: Wireless LAN Medium Access Control (MAC) and Physical Layer (PHY) specifications: Further Higher Data Rate Extension in the 2.4 GHz Band; LAN/MAN Standards Committee of the IEEE Computer Society; 69 pages.

IEEE Std 802.11 b-1999 (Supplement to IEEE Std 802.11-1999 Edition); Supplement to IEEE Standard for Information technology—Telecommunications and information exchange between systems—Local and metropolitan area networks—Specific requirements—Part 11: Wireless LAN Medium Access Control (MAC) and Physical Layer (PHY) specifications: Higher-Speed Physical Layer Extension in the 2.4 GHz Band; LAN/MAN Standards Committee of the IEEE Computer Society; Sep. 16, 1999 IEEE-SA Standards Board; 96 pages.

IEEE Std 802.11 h-2003 (Amendment to IEEE Std 802.11, 1999 Edition (Reaff 2003)); as amended by IEEE Stds 802.11 a-1999, 802.11 b-1999, 802.11 b-1999/Cor 1-2001, 802.11d-2001, and 802.11g-2003; IEEE Standard for Information technology—Telecommunications and information exchange between systems—Local and metropolitan area networks—Specific requirements—Part 11: Wireless Lan Medium Access Control (MAC) and Physical Layer (PHY) specifications Amendment 5: Spectrum and Transmit Power Management Extensions in the 5 GHz band in Europe; IEEE Computer Society LAN/MAN Standards Committee; Oct. 14, 2003; 74 pages.

IEEE Std 802.11a-1999 (Supplement to IEEE Std 802.11-1999) [Adopted by ISO/IEC and redesignated as ISO/IEC 8802-11: 1999/Amd 1:2000(E)]; Supplement to IEEE Standard for Information technology—Telecommunications and information exchange between systems—Local and metropolitan area networks—Specific requirements—Part 11: Wireless LAN Medium Access Control (MAC) and Physical Layer (PHY) specifications High-speed Physical Layer in the 5 GHz Band; LAN/MAN Standards Committee of the IEEE Computer Society; 91 pages.

IEEE Std 802.11b-1999/Cor 1-2001 (Corrigendum to IEEE Std 802.11-1999); IEEE Standard for Information technology—Telecommunications and information exchange between systems—Local and metropolitan area networks—Specific requirements—Part 11: Wireless LAN Medium Access Control (MAC) and Physical Layer (PHY) specifications Amendment 2: Higher-Speed Physical Layer (PHY) extension in the 2.4 GHz Band—Corrigendum 1; LAN/MAN Standards Committee of the IEEE Computer Society; Nov. 7, 2001; 23 pages.

IEEE Std 802.11g/D2.8, May 2002 (Supplement to ANSI/IEEE Std 802.11, 1999 Edition) DRAFT Supplement to STANDARD [for] Information Technology—Telecommunications and information exchange between systems—Local and metropolitan area networks—Specific requirements—Part 11: Wireless LAN Medium Access Control (MAC) and Physical Layer (PHY) specifications: Further Higher-Speed Physical Layer Extension in the 2.4 GHz Band; LAN/MAN Standards Committee of the IEEE Computer Society; 53 pages.

IEEE Std 802.16-2004 (Revision of IEEE Std 802.16-2001) IEE Standard for Local and metropolitan area networks; Part 16: Air Interface for Fixed Broadband Wireless Access Systems; IEEE Computer Society and the IEEE Microwave Theory and Techniquest Society; Oct. 1, 2004; 893 pages.

Kschischang, Frank R. et al., Factor Graphs and the Sum-Product Algorithm, IEEE Transactions on Information Theory, 47:2 Feb. 2001, pp. 498-519.

Li, Zongwang et al; "Efficient Encoding of Quasi-Cyclic Low-Density Parity-Check Codes"; IEEE Transactions on Communications, vol. 54, No. 1, Jan. 2006; pp. 71-81.

Richardson, Tom et al., The Renaissance of Gallager's Low-Density Parity-Check Codes, IEEE Communications Magazine, Aug. 2003, pp. 126-131.

Specification of the Bluetooth System—Specification vol. 0; Master Table of Contents & Compliance Requirements; Covered Core Package version: 2.0 +EDR; Current Master TOC issued: Nov. 4, 2004; Part A, pp. 1-74; vol. 1, pp. 1-92; vol. 2 & 3, pp. 1-814; vol. 4, pp. 1-250.

U.S. Appl. No. 11/449,066; "Tensor Product Codes Containing an Iterative Code"; Jun. 7, 2006; 71 pages.

U.S. Appl. No. 11/518,020; "Error Pattern Generation for Trellis-Based Detection and/or Decoding"; Sep. 8, 2006; 95 pages.

Wymeersch, Henk et al., Log-domain decoding of LDPC codes over GF(q), IEEE Communications Society, 2004, 5 pages.

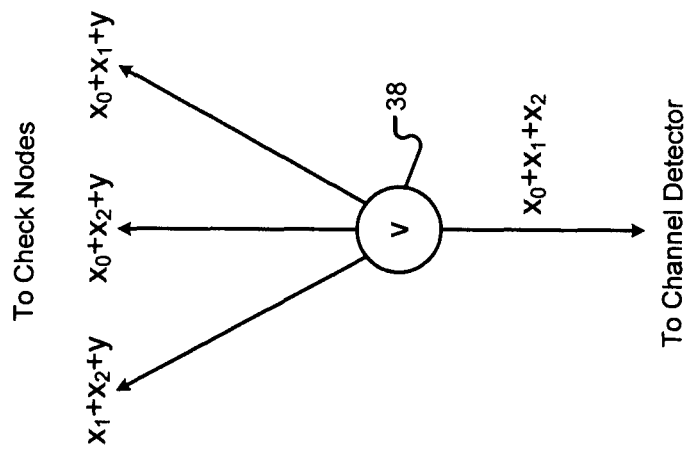
FIG. 3B
_Prior Art_
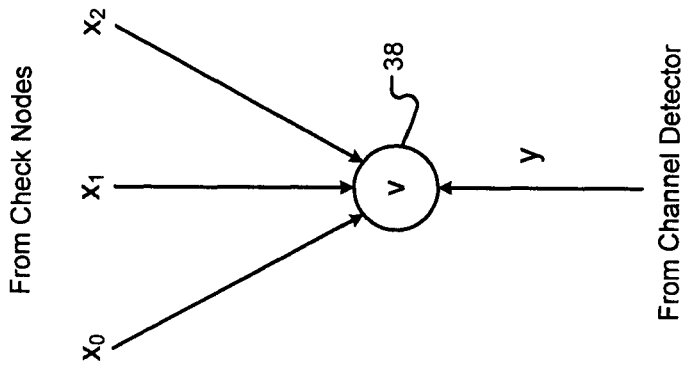
FIG. 3A
_Prior Art_

SYSTEM AND METHOD FOR DECODING CORRELATED DATA

CROSS-REFERENCE TO RELATED APPLICATIONS

The present disclosure is a continuation of U.S. patent application Ser. No. 13/470,495 (now U.S. Pat. No. 8,321,749), filed on May 14, 2012, which is a continuation of U.S. patent application Ser. No. 12/323,995 (now U.S. Pat. No. 8,181,081), filed on Nov. 26, 2008, which claims the benefit of U.S. Provisional Application No. 60/991,502, filed on Nov. 30, 2007. The entire disclosures of the applications referenced above are incorporated herein by reference.

FIELD

The present disclosure relates to communication channels, and more particularly to channel decoding systems.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

In communication systems, channel noise may cause transmission errors between a source and a receiver. Error correction coding (ECC) techniques may detect and correct channel transmission errors. Low-Customer density parity-check (LDPC) codes are examples of ECC block codes that may provide coding gains to improve performance.

A coding gain is an amount of additional noise that an ECC coded system may handle compared to an uncoded system. In other words, the coding gain may enable the ECC coded system to transmit at a lower bit error rate (BER) than an uncoded system. Therefore, in applications in which transmit power may be limited, the coding gains of LDPC codes may make the difference between reliable and unreliable communication.

Referring now to FIG. 1, a functional block diagram illustrating a conventional communication system 10 is shown. The communication system 10 may include an LDPC encoder 12, a modulator 14, a channel 16, a demodulator 18, and an iterative LDPC decoder 20. The iterative LDPC decoder 20 may include a channel detector 22, such as a soft-output Viterbi algorithm (SOVA) detector, and an LDPC decoder 24.

Using a given LDPC code, the LDPC encoder 12 encodes a stream of datawords (u) from a source. A dataword may refer to a group of binary data bits that is suitable for input to the LDPC encoder 12. The LDPC encoder 12 outputs a stream of codewords (c) which may be in the form of binary data. A codeword may refer to a group of bits generated by the LDPC encoder 12 based on an input dataword.

LDPC codes are block codes and thus an LDPC code may be represented by an (M×N) parity-check matrix (H) that includes M rows and N columns. M may represent a number of constraints, such as parity-check equations. N may represent a number of bits. Entries of the parity-check matrix may be a one or a zero. For example, a bit $v_n$ participates in a constraint $c_m$ if $H_{m,n}=1$.

The modulator 14 modulates the frequency, amplitude, and/or phase of the stream of codewords to generate a transmitted signal (w) that includes a modulated communication or storage signal. For example, the channel 16 may include a storage medium, such as a magnetic storage medium, an optical storage medium, or an electrical storage medium. The channel 16 may also include a communication channel. The channel 16 provides a received signal (w'), which may represent the transmitted signal corrupted by noise (n) or other interference.

The demodulator 18 demodulates the received signal and provides an initial estimate signal (r') of the stream of codewords. The channel detector 22 of the iterative LDPC decoder 20 receives the initial estimate signal, which may be based on hard information in blocks of data. The initial estimate signal may include corrupted bits. Hard information represents hard decisions on whether data bits are ones or zeros. In other words, a hard decision for a bit may be either a one or a zero.

The channel detector 22 may generate soft information via a soft decision that is based on the initial estimate signal and data from the channel 16. Soft information represents soft decisions on whether data bits are ones or zeros. In other words, a soft decision for a bit may be a real number that represents a probability or a likelihood of belief that the bit is a one or a zero.

For example, the soft information may be log-likelihood ratios (LLRs). An LLR is equal to the logarithm of the probability (Pr) that a bit is equal to one divided by the probability that the bit is equal to zero. In other words, the LLR of a bit v may be defined as:

$$LLR(v) = \log\frac{Pr(v=1)}{Pr(v=0)}.$$

The sign of the LLR indicates a most likely value of the bit v. For example, a negative LLR relates to a higher probability of the bit being a 0. The value of the LLR indicates certainty of the value. For example, a larger value LLR relates to a higher certainty of the bit being a 0 or a 1.

For example, the channel detector 22 may generate the soft information based on the Viterbi algorithm. The channel detector 22 may also generate the soft information based on channel factors such as a type of modulation used by the modulator 14 and channel parameters such as additive white Gaussian noise (AWGN).

The LDPC decoder 24 receives the soft information and may attempt satisfying M parity-check equations of the parity-check matrix using the soft information. However, if one or more of the parity-check constraints are not satisfied, the LDPC 24 decoder may generate feedback information. For example, a message-passing algorithm such as a sum-product algorithm may be used to generate the feedback information. And in such an example, feedback messages from check nodes may be summed to generate the feedback information for a bit.

The channel detector 22 receives the feedback information and may update the soft information from the channel based on the feedback information. For example, the channel detector 22 may sum the soft information and the feedback information to generate updated soft information. The LDPC decoder 24 receives the updated soft information, and the process repeats.

For example, the iterative LDPC decoder 20 may repeat this process for numerous iterations to decode an entire block of data. The iterative LDPC decoder 20 may continue until a valid codeword is found that satisfies all M parity-check equations. The iterative LDPC decoder 20 may also continue until an allotted time has elapsed or when a certain number of iterations have occurred.

The iterative LDPC decoder 20 generates an estimate signal (r) based on the soft information and the iterative decoding process. The estimate signal represents an estimate of the original transmitted stream of datawords. For example, the estimate signal may include the most likely datawords. The estimate signal may also include the original stream of datawords if no error exists.

Referring now to FIG. 2A, the LDPC decoder 24 may include a plurality of nodes 30. The nodes 30 illustrate the iterative message-passing process between variable and check nodes (described above) which is used by a typical LDPC decoder 24. For example, the nodes 30 represents the following parity-check matrix H:

$$H = \begin{bmatrix} 1 & 1 & 1 & 0 & 0 & 0 \\ 1 & 0 & 0 & 1 & 1 & 0 \\ 0 & 1 & 1 & 0 & 0 & 1 \\ 0 & 0 & 0 & 1 & 1 & 1 \end{bmatrix}.$$

The nodes 30 may include check nodes $c_0$ (34-0), $c_1$ (34-1), $c_2$ (34-2), and $c_3$ (34-3) (collectively referred to as check nodes 34). The nodes 30 may also includes variable nodes $v_0$ (36-0), $v_1$ (36-1), $v_2$ (36-2), $v_3$ (36-3), $v_4$ (36-4), and $v_5$ (36-5) (collectively referred to as variable nodes 36).

Referring now to FIG. 2B, the relationship between the check nodes 34, the variable nodes 36, and the parity-check matrix H is shown. The variable nodes 36 correspond to the N columns of the parity-check matrix H. The check nodes 34 correspond to the M rows of the parity-check matrix H.

The interacting nodes 30 may be referred to as a bipartite graph because no nodes of the same type (i.e., variable nodes and check nodes) are connected to each other. Communication lines connect check nodes 34 to variable nodes 36. In other words, one of the check nodes 34 is connected to one of the variable nodes 36 if the corresponding entry in the parity-check matrix is a one. For example, check node $c_0$ (34-0) is connected to variable node $v_0$ (36-0) because $H_{0,0}=1$.

Information received from the channel 16 is communicated to the variable nodes 36 via the channel detector 22. The variable nodes 36 may pass the information up to the check nodes 34. For example, variable node $v_0$ (36-0) may pass a message (i.e., channel information) to check nodes $c_0$ (34-0) and $c_1$ (34-1) because the nodes are connected.

The check nodes 34 may compute messages based on the information received from the variable nodes 36. For example, one of the check nodes 34 may compute a message by summing all messages received from variable nodes 36. The check nodes 34 may then pass the messages back to respective variable nodes 36.

For example, check node $c_0$ (34-0) may compute a message by summing messages received from variable nodes $v_0$ (36-0), $v_1$ (36-1), and $v_2$ (36-2) because the nodes are connected. Check node $c_0$ (34-0) may also send the message back to variable nodes $v_0$ (36-0), $v_1$ (36-1), and $v_2$ (36-2) because the nodes are connected.

The variable nodes 36 may then compute messages based on the messages received from the check nodes 34. For example, one of the variable nodes 36 may compute a message by summing all messages received from check nodes 36. For example, variable node $v_0$ (36-0) may compute a feedback signal by summing messages received from check nodes $c_0$ (34-0) and $c_1$ (34-1) because the nodes are connected.

The check nodes 34 may send the feedback signals back to the channel detector 22. The channel detector 22 may generate updated soft information based on the feedback signals and the soft information. The LDPC decoder 24 then receives the updated soft information.

The iterative message-passing process may be repeated until a predetermined condition is satisfied. After the predetermined condition is satisfied, the iterative LDPC decoder 20 may generate and output an estimate signal r. For example, the iterative message-passing process may continue until a predetermined number of iterations have occurred or until all parity-check equations are satisfied. For example, the parity-check equations corresponding to the parity-check matrix H are:

$$c_0 = v_0 + v_1 + v_2$$

$$c_1 = v_0 + v_3 + v_4$$

$$c_2 = v_1 + v_2 + v_5$$

$$c_3 = v_3 + v_4 + v_5.$$

Referring now to FIG. 3A, an exemplary variable node computation is shown. A variable node 38 receives an initial bit estimate (y), which may be an LLR, from a channel detector (not shown). The variable node 38 may also receive return messages $x_0$, $x_1$, and $x_2$ from the different check nodes. The variable node 38 may generate return messages based on the received return messages and the initial bit estimate. For example, the variable node 38 may generate return messages for each check node by summing all of the other received messages, as shown in FIG. 3B.

SUMMARY

A decoding system for a communication channel includes N parallel channel detection modules that generate N first probability vectors based on sequences of X correlated bits in each of N groups of correlated bits, respectively. The decoding system also includes N parallel updating modules that generate M second probability vectors based on the N first probability vectors and N feedback signals. The decoding system also includes N parallel estimation modules that generate estimates of the X correlated bits in each of the N groups of correlated bits based on the M second probability vectors. The decoding system also includes N parallel decoding modules that generate the N feedback signals and N output signals based on the estimates of the X correlated bits in each of the N groups of correlated bits. X is an integer greater than one, M is an integer greater than or equal to one, and N is an integer greater than or equal to M.

In other features, the decoding system further includes N parallel reference modules that selectively set the N feedback signals and a portion of at least one of the M second probability vectors to a reference voltage based on a difference between K and X. K is based on a number of adders in each of the N parallel updating modules, and K is an integer greater than or equal to X.

In other features, the decoding system further includes a distribution module that selectively distributes the N first probability vectors and the N feedback signals to the N parallel updating modules based on a difference between K and X. K is based on a number of adders in each of the N parallel updating modules, and K is an integer greater than or equal to X.

In other features, the decoding system further includes an interleaving module that receives the N feedback signals, that interleaves the N feedback signals, and that selectively distributes the N interleaved feedback signals to the N parallel updating modules based on a difference between K and X. The decoding system also includes a deinterleaving module that receives interleaved estimates of the X correlated bits in each of the N groups of correlated bits from the N parallel estimation modules, that deinterleaves the interleaved estimates of the X correlated bits in each of the N groups of correlated bits, and that outputs the estimates of the X correlated bits in each of the N groups of correlated bits. K is based on a number of adders in each of the N parallel updating modules, and K is an integer greater than or equal to X.

In still other features, the systems and methods described above are implemented by a computer program executed by one or more processors. The computer program can reside on a computer readable medium such as but not limited to memory, nonvolatile data storage, and/or other suitable tangible storage mediums.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF DRAWINGS

The present disclosure will become more fully understood from the detailed description and the accompanying drawings, wherein:

FIGS. 3A and 3B are schematics illustrating an exemplary variable node computation;

DESCRIPTION

Figure 1:
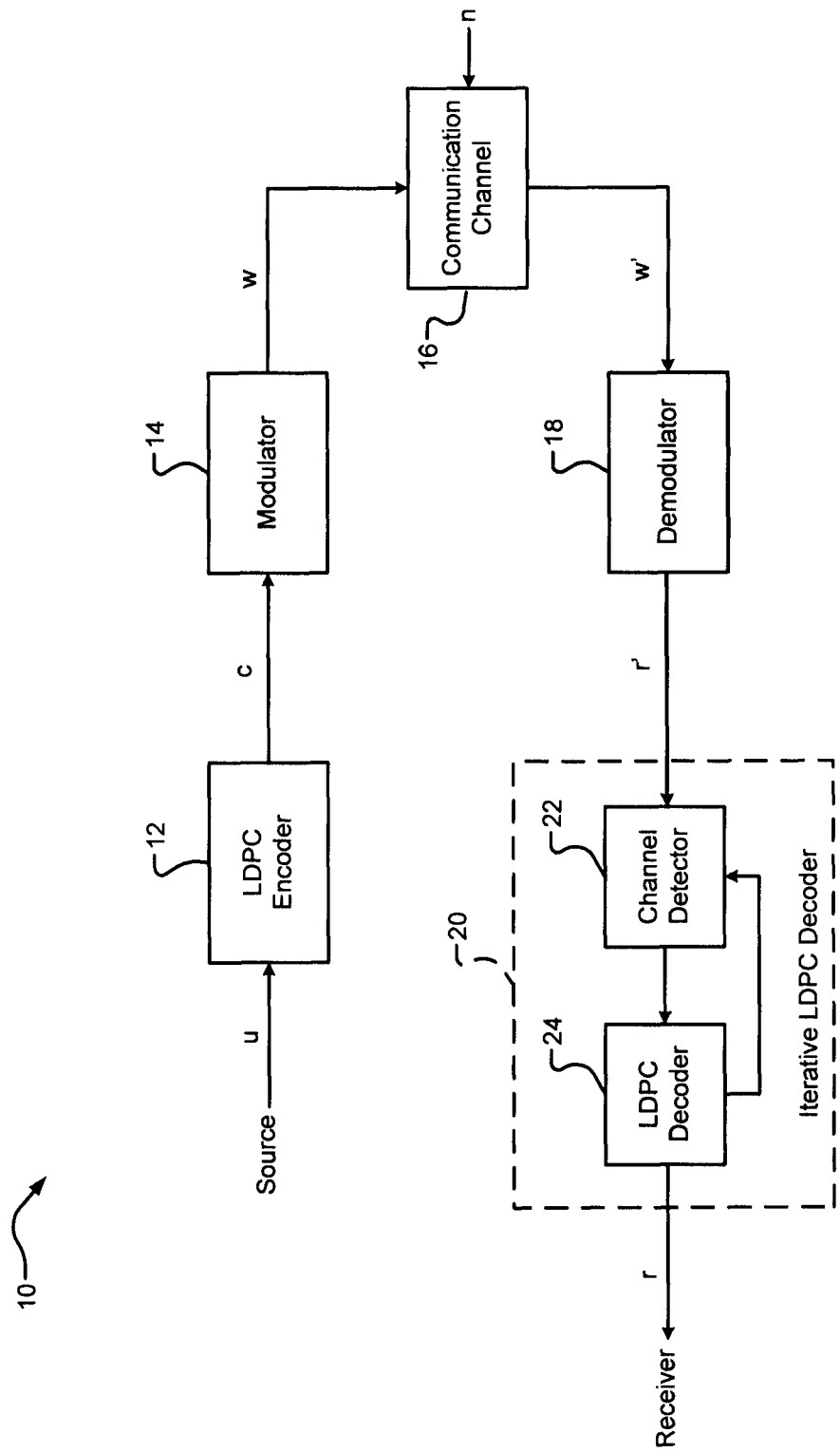
FIG. 1 is a functional block diagram of a conventional communication system.
Figures 2A, 2B:
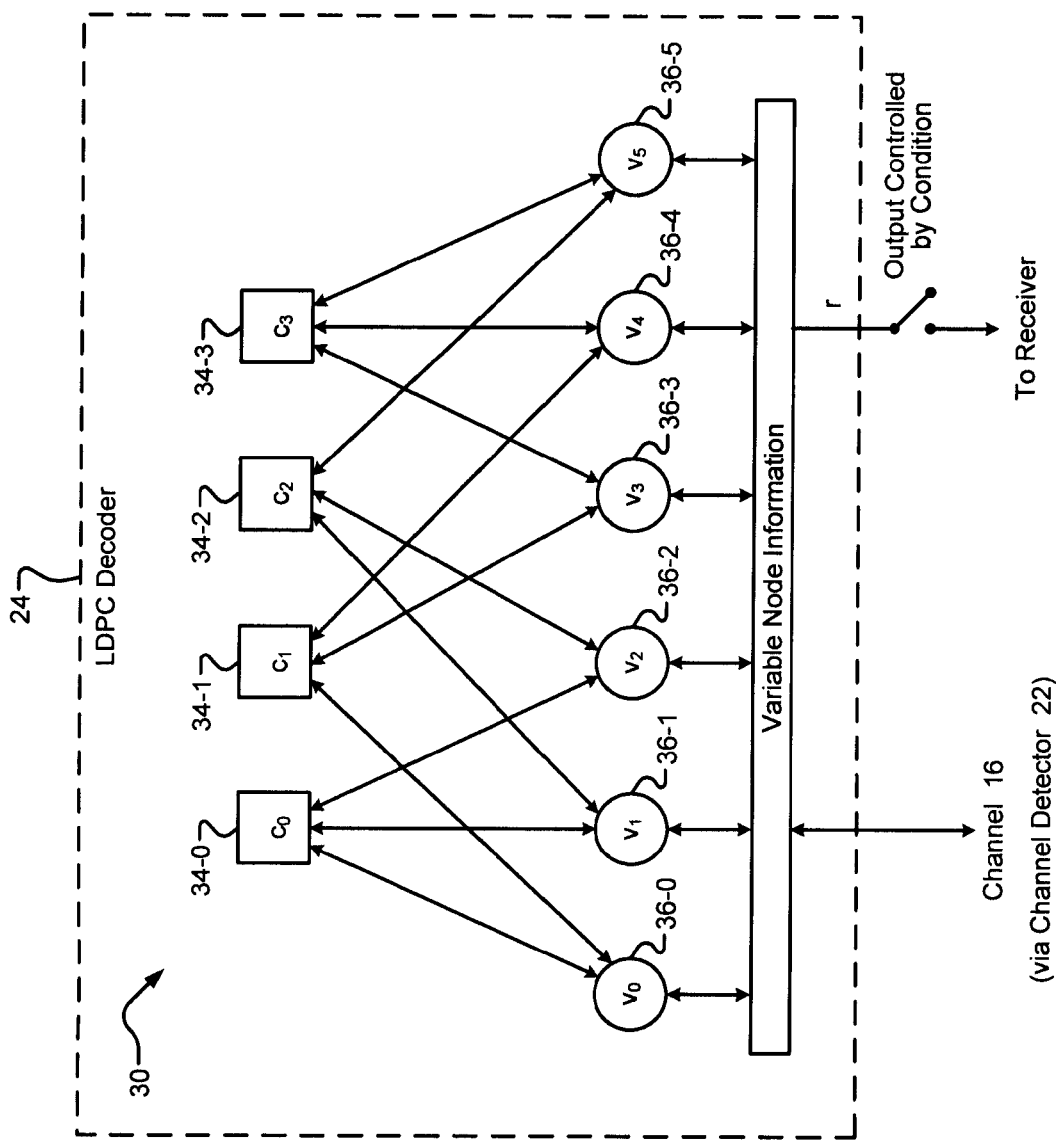
FIG. 2A is a functional block diagram of a conventional LDPC decoder.
FIG. 2B is a parity-check matrix representing an exemplary LDPC code.

The following description is merely exemplary in nature and is in no way intended to limit the disclosure, its application, or uses. For purposes of clarity, the same reference numbers will be used in the drawings to identify similar elements. As used herein, the phrase at least one of A, B, and C should be construed to mean a logical (A or B or C), using a non-exclusive logical or. It should be understood that steps within a method may be executed in different order without altering the principles of the present disclosure.

As used herein, the term module may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality. The software or firmware programs can be tangibly stored on a computer-usable or computer-readable medium. For the purposes of this description, a computer-usable or computer readable medium can be any apparatus that can contain, store, communicate, propagate, or transport the program for use by or in connection with the instruction execution system, apparatus, or device. The medium can be an electronic, magnetic, optical, electromagnetic, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-RAN) and DVD.

Inputs and outputs of a communication channel may include correlated data. The correlated data may include statistical relationships between different data bits. For example, communication systems that include channels with memory may output correlated data. Channels with memory may include partial-response channels in data storage applications.

For example, communication systems using tensor-product codes (TPCs) may also include channels that output correlated data. TPCs include two levels of code (e.g., C1 and C2), and thus the data that is output from the outer level of code C2 may be correlated to the input and/or output of inner level code C1.

For example, a multi-constellational transmission system such as a quadrature amplitude modulation (QAM) system may include a channel that outputs correlated data. The QAM system may group and map data bits to signal points for transmission. Thus, the data bits in the same groups may be correlated.

Typical decoders assume that all input data bits are statistically independent. The present disclosure improves decoders by modifying the iterative decoding process with regard to correlated data, which may result in a higher performance (e.g., faster) decoder. If a channel outputs correlated data, the correlation may only span a few data bits. Therefore, data bits that are likely to have correlated information may be grouped together and decoded together. The number of data bits in each group may vary, and data bits within a particular group need not be consecutive.

Furthermore, in high-performance applications, such as magnetic recording data storage, stringent size and power constraints may require efficient decoder implementations. Typical hardware systems only provide for single bit (i.e., bit-by-bit) error correction. In other words, typical hardware systems do not provide for a single error correction architecture that may operate concurrently on several different groups and/or sequences of correlated data bits. Additionally, typical hardware systems do not provide for a single error correction architecture that may operate at various error correction code rates and on various lengths (or sizes) of correlated input data sequences.

Figure 4A:
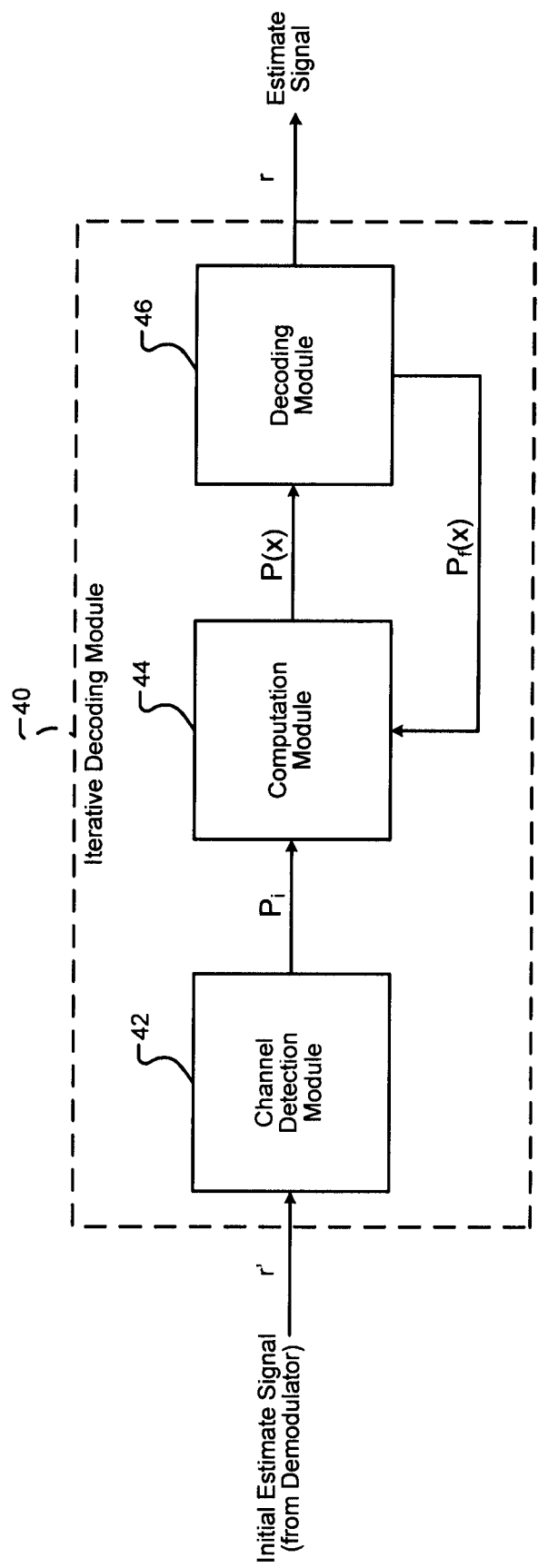
FIG. 4A is a functional block diagram of an iterative decoding module according to the present disclosure.

Referring now to FIG. 4A, an iterative decoding module 40 is shown. The iterative decoding module 40 may include a channel detection module 42, a computation module 44, and a decoding module 46. For example, the channel detection module 42 may include, for example, a soft-output Viterbi algorithm (SOVA) detector. The decoding module 46 may include, for example, an LDPC decoder.

The iterative decoding module 40 may decode LDPC encoded data bits based on an iterative decoding process using soft information. The soft information may be probabilities or likelihoods of belief that the data bits are ones or zeros. For example, the soft information may be log-likelihood ratios (LLRs) for each of the data bits.

The channel detection module 42 receives an initial estimate signal (r') from a channel via a demodulator (not shown). The channel detection module 42 may group k correlated data bits together from the received signal. The channel detection module 42 generates the soft information based on the k correlated data bits. More specifically, the channel detection module 42 generates an initial probability vector $P_i$ of length $2^k-1$. For example, the initial probability vector $P_i$ may include LLRs for each possible sequence of the k correlated data bits.

The computation module 44 receives the initial probability vector $P_i$. The computation module 44 also receives feedback signals $P_f(x_0)$-$P_f(x_{k-k})$ (collectively referred to as feedback signals $P_f(x)$) for each of the k data bits from the decoding module 46. For example, the feedback signals $P_f(x)$ may be LLRs for each of the k data bits to be used in the next decoding iteration.

The computation module 44 generates bit estimations $P(x_0)$-$P(x_{k-1})$ (collectively referred to as bit estimations $P(x)$) for each of the k data bits based on the initial probability vector $P_i$ and the feedback signals $P_f(x)$. The bit estimations $P(x)$ may be LLRs for each of the k data bits.

The decoding module 46 receives the bit estimations $P(x)$. The decoding module 46 may generate an estimate signal (r) based on the bit estimations $P(x)$ if a predetermined condition has been satisfied. The condition may require, for example, that a predetermined number of decoding iterations occur or that all parity-check equations be satisfied. If the condition is satisfied, the decoding module 46 may output the estimate signal.

If the predetermined condition is not satisfied, the decoding module 46 generates the feedback signals $P_f(x)$ for each of the k data bits. The feedback signals $P_f(x)$ may be generated based on typical message-passing decoding between nodes. For example, a feedback signal $P_f(x)$ for a data bit may be a sum of check node messages received at a variable node corresponding to the data bit. The decoding module 46 sends the feedback signals $P_f(x)$ the computation module 44 to be used in another decoding iteration. This iterative decoding process may be repeated until the predetermined condition is satisfied.

Figure 4B:
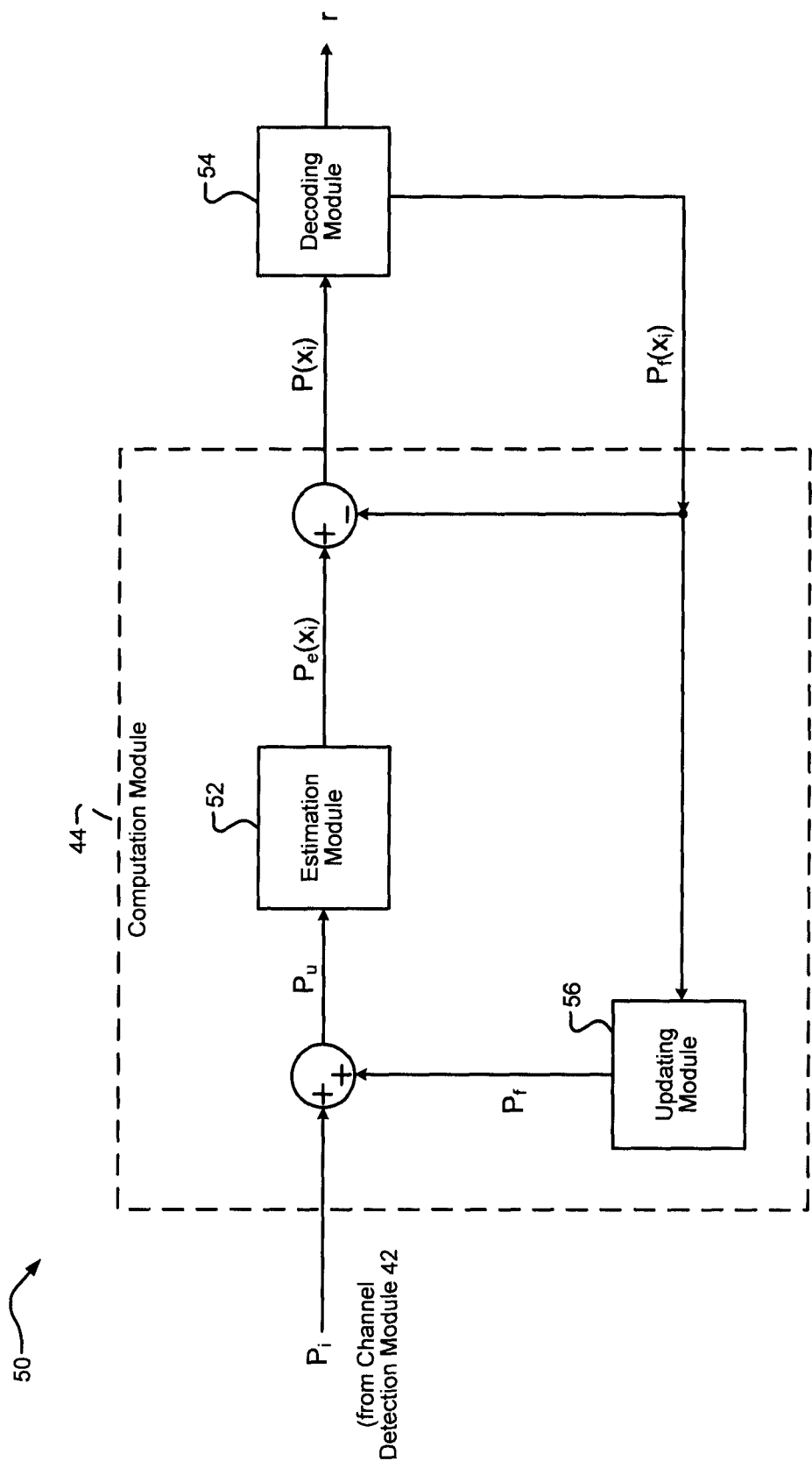
FIG. 4B is a schematic illustrating an iterative decoding process of a group of correlated information bits according to the present disclosure.

Referring now to FIG. 4B, a schematic 50 illustrates the iterative decoding process of a group of k correlated data bits discussed above with regard to FIG. 4A. Typically, channel detectors only generate LLRs for individual data bits. In other words, typical decoders perform iterative LDPC decoding in a bit-by-bit process. For example, for a group of k data bits $x_0$, $x_1$, $x_{k-1}$, the initial probabilities (Pr) may be:

$$\log\frac{Pr(x_0=1)}{Pr(x_0=0)}, \log\frac{Pr(x_1=1)}{Pr(x_1=0)}, \ldots, \log\frac{Pr(x_{k-1}=1)}{Pr(x_{k-1}=0)}.$$

However, the channel detection module 42 generates an initial probability vector $P_i$ for the group x of k correlated data bits, where $x=x_0, x_{k-1}$. For example, the channel detection module 42 may generate an initial probability vector $P_i$ of length $2^k-1$ that includes LLRs for each of the sequences of k correlated data bits:

$$P_i = \begin{bmatrix} \log\frac{Pr(x=0\ldots 01)}{Pr(x=0\ldots 00)} \\ \log\frac{Pr(x=0\ldots 10)}{Pr(x=0\ldots 00)} \\ \log\frac{Pr(x=0\ldots 11)}{Pr(x=0\ldots 00)} \\ \vdots \\ \log\frac{Pr(x=1\ldots 11)}{Pr(x=0\ldots 00)} \end{bmatrix}.$$

Each entry of the initial probability vector $P_i$ is measured against an all-zero sequence $x=0\ldots 00$. The all-zero sequence entry may be omitted as an entry in the initial probability vector $P_i$ because measuring the all-zero sequence against the all-zero sequence is trivial:

$$\log\frac{Pr(x=0\ldots 00)}{Pr(x=0\ldots 00)} = 0.$$

The initial probability vector $P_i$ may be combined with a feedback probability vector $P_f$ to generate an updated probability vector $P_u$. However, for the first decoding iteration $P_f=0$ because a decoding module 54 has not generated feedback signals $P_f(x)$ yet. Therefore, $P_u=P_i$ for the first decoding iteration.

An estimation module 52 generates initial bit estimations $P_e(x_0), P_e(x_1) \ldots, P_e(x_{k-1})$ (collective referred to as initial bit estimations $P_e(x)$) based on the updated probability vector $P_u$. For example, the estimation module 52 may generate the initial bit estimations $P_e(x)$ as follows:

$$P_e(x_i) = \log\frac{Pr(x_i=1)}{Pr(x_i=0)} = \log\frac{\sum_{a_i=1} Pr(x=a)}{\sum_{a_i=0} Pr(x=a)},$$

$$P_e(x_i) \approx \max_{a_i=1}(P_u(a)) - \max_{a_i=0}(P_u(a)),$$

where $\alpha_i$ represents a binary value of the $i^{th}$ entry in the sequence of correlated data bits x. $P_u(a_i)$ represents entries of the updated probability vector $P_u$. The first line of the above formula may be used to generate exact initial bit estimations $P_e(x)$. However, to reduce overall complexity the initial bit estimations $P_e(x)$ may be generated based on the second line of the above formula.

The bit estimations $P(x)$ to be used by the decoding module 54 may be generated by subtracting the feedback signals $P_f(x)$ from the initial bit estimations $P_e(x)$. However, for the first decoding iteration $P_f(x)=0$. Therefore, the decoding module 54 receives the bit estimations $P(x)$, which for this iteration are the initial bit estimations $P_e(x)$.

The decoding module 54 receives the bit estimations $P(x)$. The decoding module 54 may generate an estimate signal (r) based on the bit estimations $P(x)$ if a predetermined condition has been satisfied. The condition may require, for example, that a predetermined number of decoding iterations occur or that all parity-check equations be satisfied. If the condition is satisfied, the decoding module 46 may output the estimate signal. For example, the estimate signal may be most probable datawords, or the original stream of datawords (u) if no error exists.

If the predetermined condition is not satisfied, the decoding module 54 generates the feedback signals $P_f(x)$ for each of the k data bits. The feedback signals $P_f(x)$ may be generated based on typical message-passing decoding between variable and check nodes.

For example, a feedback signal $P_f(x)$ for a data bit may be a sum of check node messages received at a variable node corresponding to the data bit. More specifically, a feedback signal $P_f(x_i)$ may be computed for a bit $x_i$ by summing messages from check nodes to a variable node corresponding to data a bit (v). In one implementation, if $\alpha_0, \ldots, \alpha_{k-1}$ represent the messages from k check nodes to the variable node corresponding to the data bit, then the feedback signal for the data bit is:

$$P_f(v) = \alpha_0 + \ldots + \alpha_{k-1}.$$

The decoding module 46 sends the feedback signals $P_f(x)$ to the computation module 44 to be used in another decoding iteration. An updating module 56 receives the feedback signals $P_f(x)$ and generates the feedback probability vector $P_f$ based on the feedback signals $P_f(x)$. For example, the updating module 56 may generate the feedback probability vector $P_f$ as follows, where each entry of the feedback probability vector $P_f$ corresponds to a bit sequence on the right:

$$P_f = \begin{bmatrix} P_f(x_0) \\ P_f(x_1) \\ P_f(x_0) + P_f(x_1) \\ P_f(x_2) \\ \vdots \\ P_f(x_{k-2}) + \ldots + P_f(x_1) + P_f(x_0) \\ P_f(x_{k-1}) \\ P_f(x_{k-1}) + P_f(x_0) \\ P_f(x_{k-1}) + P_f(x_1) + P_f(x_0) \\ P_f(x_{k-1}) + P_f(x_2) \\ \vdots \\ P_f(x_{k-1}) + P_f(x_{k-2}) + \ldots + P_f(x_1) + P_f(x_0) \end{bmatrix} \begin{array}{l} \to 00\ldots001 \\ \to 00\ldots010 \\ \to 00\ldots011 \\ \to 00\ldots100 \\ \to \vdots \\ \to 01\ldots011 \\ \to 10\ldots000 \\ \to 10\ldots001 \\ \to 10\ldots011 \\ \to 10\ldots100 \\ \to \vdots \\ \to 11\ldots111 \end{array}$$

The updated probability vector $P_u$ may be generated based on the initial probability vector $P_i$ and the feedback probability vector $P_f$. For example, the updated probability vector $P_u$ may be generated by summing the initial probability vector $P_i$ and the feedback probability vector $P_f(P_u = P_i + P_f)$.

The estimation module 52 may generate new initial bit estimations $P_e(x)$ based on the updated probability vector $P_u$. For example, the estimation module 52 may generate the new initial bit estimations $P_e(x)$ based on the same method used in the first decoding iteration (above).

New bit estimations $P(x)$ for a new decoding cycle may then be generated based on the new initial bit estimations $P_e(x)$ and the feedback signals $P_f(x)$. For example, the new bit estimations $P(x)$ may be generated by subtracting the feedback signals $P_f(x)$ from the corresponding new initial bit estimations $P_e(x)$:

$$P(x) = P_e(x) - P_f(x).$$

The decoding module 54 receives the new bit estimations $P(x)$. The decoding module 54 may generate and output the estimate signal based on the new bit estimations $P(x)$ if the predetermined condition has been satisfied. If the predetermined condition has not been satisfied, the decoding module 54 may generate new feedback signals $P_f(x)$ and the process may repeat for another decoding iteration.

Figure 5:
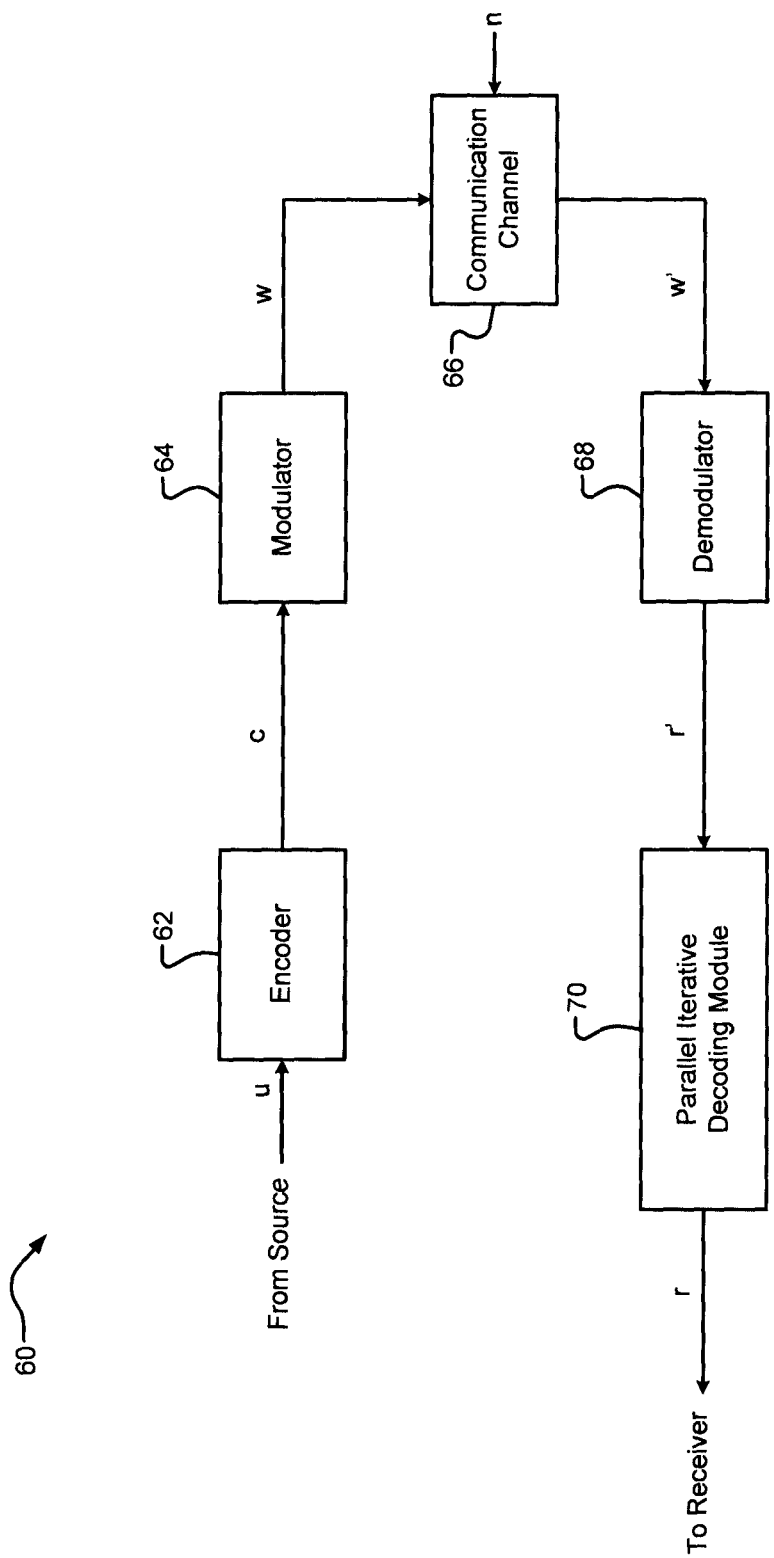
FIG. 5 is a functional block diagram of a communication system according to the present disclosure.

Referring now to FIG. 5, a communication system 60 is shown. The communication system may include an encoder 62, a modulator 64, a communication channel 66, a demodulator 68, and a parallel iterative decoding module 70. For example, the communication system 60 may encode and/or decode data using low-density parity-check (LDPC) codes and techniques.

The encoder 62 encodes a stream of datawords (u) from a source using a code (C) such as an LDPC code. A dataword may refer to a group of binary data that is suitable for input to the encoder 62. The encoder 62 outputs a stream of codewords (c) which may be in the form of binary data. A codeword may refer to a group of bits generated by the encoder 62 based on an input dataword.

The modulator 64 modulates the frequency, amplitude, and/or phase of the stream of codewords (c) to generate a transmitted signal (w), such as a communication or storage signal. The channel 66 may be a storage medium, such as a magnetic storage medium, an optical storage medium, or an electrical storage medium. The channel 66 may also be a communication channel.

The channel 66 provides a received signal (w'), which may be a corrupted version of the transmitted signal due to noise (n) or interference. The demodulator 68 demodulates the received signal and provides an initial estimate signal (r') of the stream of codewords.

The parallel iterative decoding module 70 receives the initial estimate signal. The initial estimate signal may include corrupted bits. The parallel iterative decoding module 70 may group the initial estimate signal into b groups of correlated data bits. The parallel iterative decoding module 70 may generate soft information, such as LLRs, based on the b groups of correlated data bits.

For example, the parallel iterative decoding module 70 may generate soft information based on the Viterbi algorithm. The parallel iterative decoding module 70 may also generate the soft information based on channel factors such as the type of modulation used by the modulator 64 and channel parameters such as additive white Gaussian noise (AWGN).

The parallel iterative decoding module 70 may decode more than one of the b groups concurrently. Additionally, the parallel iterative decoding module 70 may decode groups of different sizes (or lengths), up to k bits each. Thus, the parallel iterative decoding module 70 may be faster than and may provide a higher bit-throughput than typical bit-by-bit decoders. The parallel iterative decoding module 70 may also achieve a constant bit-throughput for different sizes of groups by interleaving the received data bits and disabling adders used in processing.

The parallel iterative decoding module 70 generates an estimate signal (r). For example, the parallel iterative decoding module 70 may generate the estimate signal by combining b group estimate signals $r_0, r_1, \ldots, r_{b-1}$ corresponding to the b groups of correlated information bits. The estimate signal represents an estimate of the original stream of datawords (u) after encoding, transmission, and decoding. In one implementation, the estimate signal represents an estimate of the original stream of datawords because the original stream of data words may be corrupted due to channel noise. For example, the estimate signal r may be most probable datawords, or it may be the same as the original stream of datawords u if no error exists.

Figure 6:
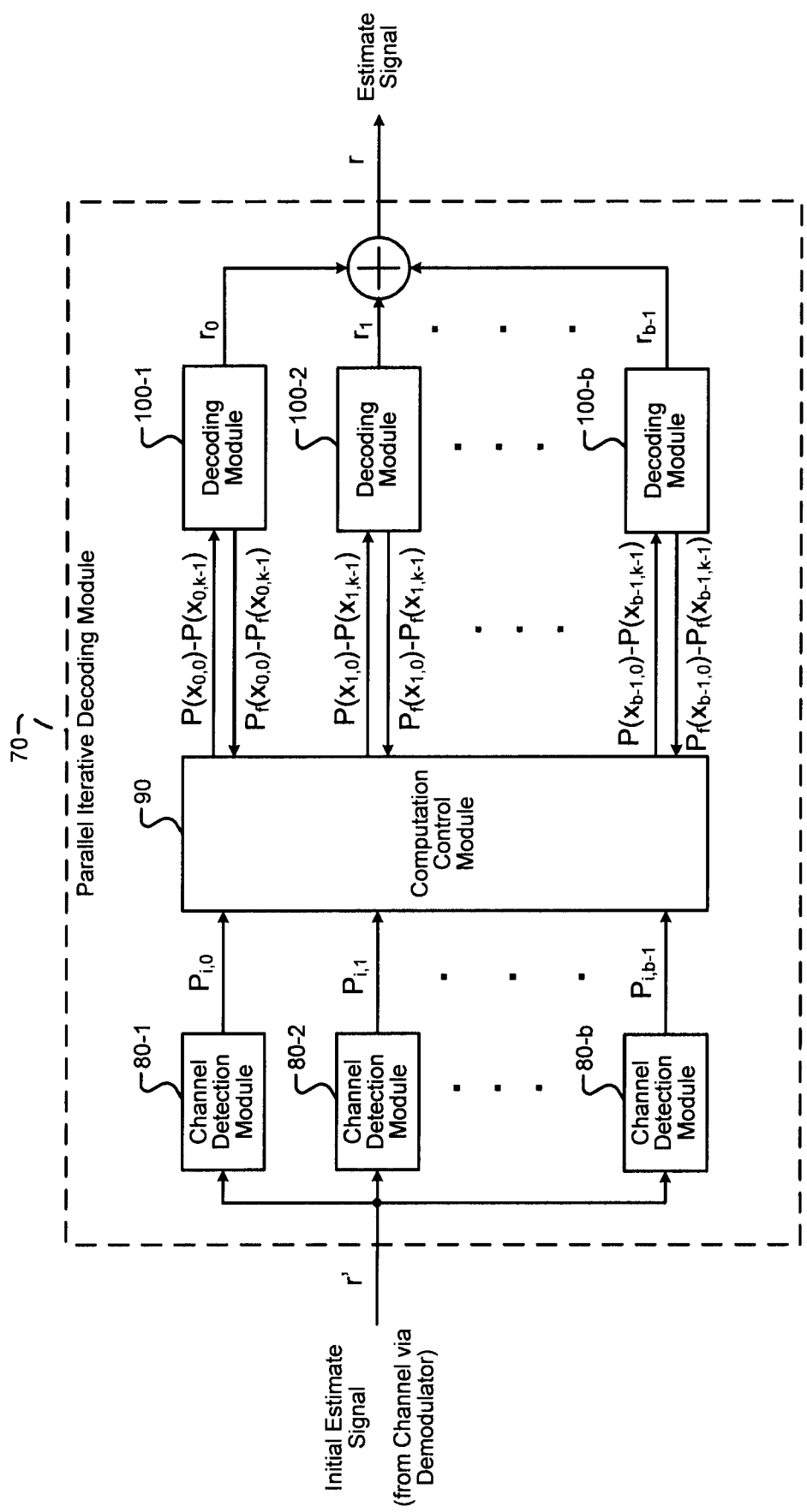
FIG. 6 is a functional block diagram of a parallel iterative decoding module according to the present disclosure.

Referring now to FIG. 6, a functional block diagram of a parallel iterative decoding module 70 is shown. The parallel iterative decoding module 70 may include b parallel channel detection modules 80-1, 80-2, ..., 80-b (collectively referred to as channel detection modules 80). The parallel iterative decoding module 70 may also include a decoding control system 90, hereinafter referred to as computation control module 90. The parallel iterative decoding module 70 may further include b parallel decoding modules 100-1, 100-2, ... 100-b (collectively referred to as decoding modules 100).

The channel detection modules 80 receive the initial estimate signal (r') from a channel via a demodulator (not shown). The channel detection modules 80 may group the initial estimate signal into b groups of up to k correlated bits each. The maximum number of bits k per group b may be based on a number of adders and/or multiplexers in the channel detection modules 80, the computation control module 90, and the decoding modules 100.

The channel detection modules 80 may also include soft-output Viterbi algorithm (SOVA) detectors. The channel detection modules 80 generate soft information based on the b groups of correlated data bits. For example, the channel detection modules 80 may generate LLRs based on sequences of correlated data bits within each of the b groups.

In one implementation, the channel detection modules 80 generate b initial probability vectors $P_{i,0}, P_{0,1}, \ldots, P_{i,b-1}$ (collectively referred to as initial probability vectors $P_i$). The initial probability vectors may include LLRs for each possible sequence of bits within each of the b groups. In one implementation, each of the initial probability vectors $P_i$ may correspond to one of the b groups of bits. For example, each of the initial probability vectors $P_i$ may be of length $2^k-1$, where k is the maximum number of bits per group b:

$$P_i = \begin{bmatrix} \log\frac{Pr(x=0 \ldots 01)}{Pr(x=0 \ldots 00)} \\ \log\frac{Pr(x=0 \ldots 10)}{Pr(x=0 \ldots 00)} \\ \log\frac{Pr(x=0 \ldots 11)}{Pr(x=0 \ldots 00)} \\ \vdots \\ \log\frac{Pr(x=1 \ldots 11)}{Pr(x=0 \ldots 00)} \end{bmatrix}.$$

The computation control module 90 receives the initial probability vectors $P_i$. The computation control module 90 also receives b×k feedback signals $P_f(x_{0,0}), P_f(x_{0,1}), \ldots, P_f(x_{b-1,k-1})$ (collectively referred to as feedback signals $P_f(x)$) from the decoding modules 100. The computation control module 90 generates b×k bit estimations $P(x_{0,0}), P(x_{0,1}), \ldots, P(x_{b-1,k-1})$ (collectively referred to as bit estimations P(x)) corresponding to each of the k bits in each of the b groups. The computation control module 90 may generate the bit estimations P(x) based on the initial probability vectors $P_i$ and the feedback signals $P_f(x)$.

The decoding modules 100 receive the bit estimations P(x) from the computation control module 90. For example, decoding module 100-0 may receive bit estimations $P(x_{0,0})$–$P(x_{0,k-1})$ corresponding to each of the k bits in a first group (i.e., group 0). The decoding modules 100 may further include LDPC decoders. The decoding modules 100 may generate the b group estimate signals $r_0, r_1, r_{b-1}$ based on the bit estimations P(x) if conditions have been satisfied. For example, the decoding modules 100 may generate the b group estimate signals if a certain number of decoding iterations have occurred or if all parity-check equations are satisfied.

If the conditions are not satisfied, the decoding modules 100 may generate the feedback signals $P_f(x)$. The decoding modules 100 may generate the feedback signals $P_f(x)$ based on the bit estimations P(x) and a typical message-passing decoding process between nodes. For example, the decoding modules 100. The decoding modules 100 may send the feedback signals $P_f(x)$ back to the computation control module 90 to be used in another decoding iteration. This iterative decoding process may be repeated until the conditions are satisfied.

Figure 7A:
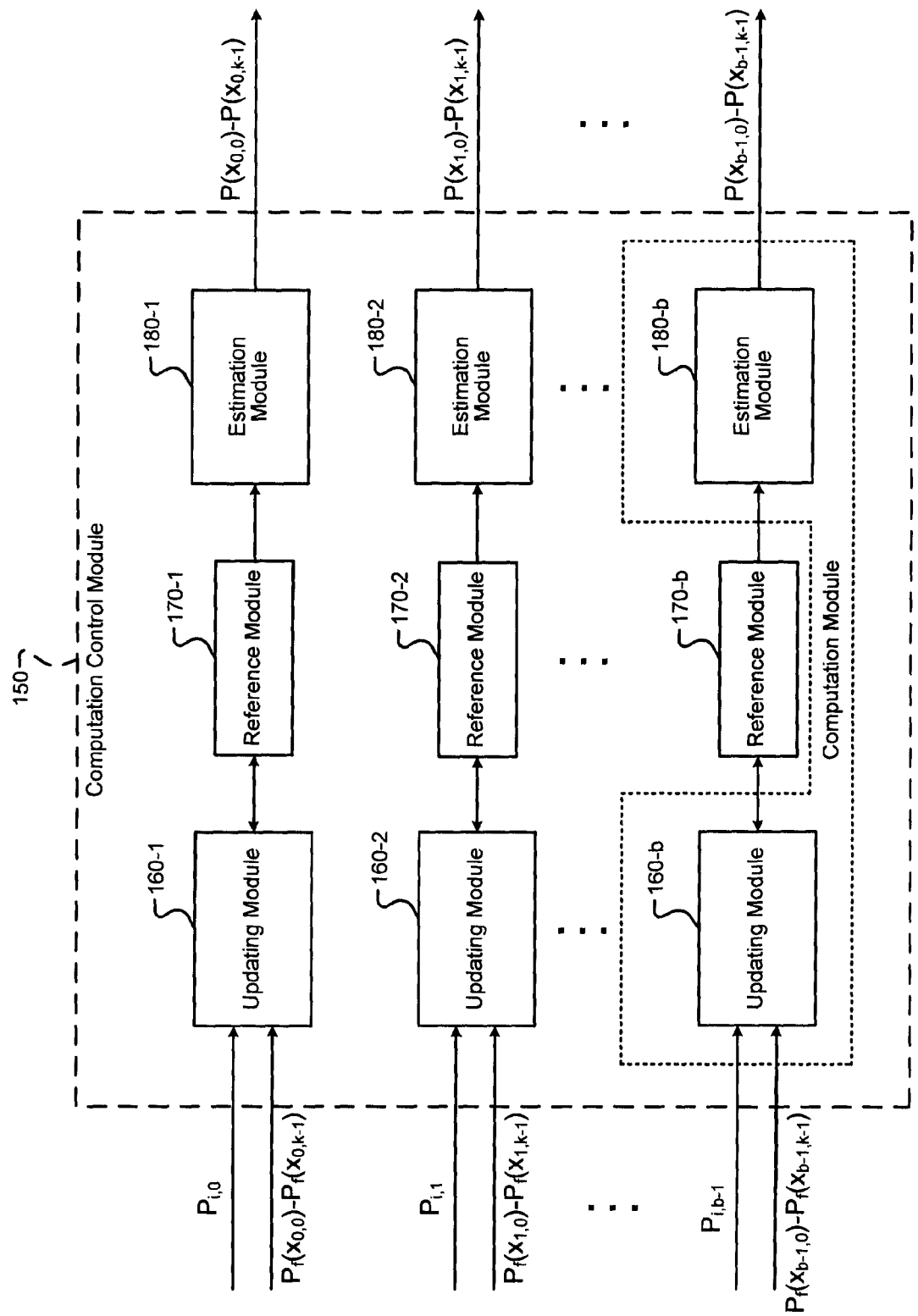
FIG. 7A is a functional block diagram of a first embodiment of a parallel computation module according to the present disclosure.

Referring now to FIG. 7A, a first embodiment of the computation control module 150 is shown. The computation control module 150 may ground signals and/or probability vector entries. For example, grounding signals and/or probability vector entries may prevent unused adders for groups of less than k bits in size from affecting probability computation (and thus decoding). Thus, the computation control module 150 may provide for processing of a constant number of groups b of up to k bits each.

The computation control module 150 may include b parallel updating modules 160-1, 160-2, ..., 160-b (collectively referred to as updating modules 160). The computation control module 150 may also include b parallel reference modules 170-1, 170-2, ..., 170-b (collectively referred to as reference modules 170). The computation control module 150 may further include b parallel estimation modules 180-1, 180-2, ..., 180-b (collectively referred to as estimation modules 180).

Furthermore, one of the updating modules 160 and one of the estimation modules 180 may collectively be referred to as a computation module (as seen previously in FIG. 4B). For example, updating module 160-b and estimation module 180-b may be referred to collectively as computation module b (i.e., the $b^{th}$ computation module). Each computation module may process up to k bits per cycle.

The updating modules 160 receive respective initial probability vectors $P_i$ and the feedback signals $P_f(x)$. For example, updating module 160-1 may receive initial probability vector $P_0$ and feedback signals $P_f(x_{0,0})$–$P_f(x_{0,k-1})$. In one implementation, updating module 160-1 may receive feedback signals corresponding to each of the bits in the first group (i.e., group 0).

The updating modules 160 generate b feedback probability vectors $P_{f,0}, P_{f,1} \ldots, P_{f,b-1}$ (collectively referred to as feedback probability vectors $P_f$) based on the feedback signals $P_f(x)$. For example, for a group of k bits:

$$P_f = \begin{bmatrix} P_f(x_0) \\ P_f(x_1) \\ P_f(x_0) + P_f(x_1) \\ P_f(x_2) \\ \vdots \\ P_f(x_{k-2}) + \ldots + P_f(x_1) + P_f(x_0) \\ P_f(x_{k-1}) \\ P_f(x_{k-1}) + P_f(x_0) \\ P_f(x_{k-1}) + P_f(x_1) + P_f(x_0) \\ P_f(x_{k-1}) + P_f(x_2) \\ \vdots \\ P_f(x_{k-1}) + P_f(x_{k-2}) + \ldots + P_f(x_1) + P_f(x_0) \end{bmatrix}$$

However, for groups of bits of size less than k, computation of the bit estimations P(x) may be modified as follows:

$$P(x_i) =$$

$$\log \frac{\sum_{a_i=1} P(x_1^k = a_1^k)}{\sum_{a_i=0} P(x_1^k = a_1^k)} = \log \frac{\sum_{a_i=1,a_m=0} P(x_1^k = a_1^k) + \sum_{a_i=1,a_m=1} P(x_1^k = a_1^k)}{\sum_{a_i=0,a_m=0} P(x_1^k = a_1^k) + \sum_{a_i=0,a_m=1} P(x_1^k = a_1^k)} \approx$$

$$\max\left(\max\left(P_u \atop a_i=1,a_m=0 (a_1^k)\right), \max\left(P_u \atop a_i=1,a_m=1 (a_1^k)\right)\right) - \max\left(\max\left(P_u \atop a_i=0,a_m=0 (a_1^k)\right), \max\left(P_u \atop a_i=0,a_m=1 (a_1^k)\right)\right),$$

where $\alpha_l^k$ represents the following vector:

$$a_1^k = \begin{bmatrix} a_0 \\ a_1 \\ \vdots \\ a_{k-1} \end{bmatrix}.$$

Thus, the updating modules 160 may selectively ground (i.e., set to zero) one or more feedback signals $P_f(x)$ to support processing of group sizes less than k bits. For example, the updating modules 160 may communicate with the reference modules 170, and the reference modules 170 may selectively set one or more feedback signals to a reference voltage, such as ground.

For example, for processing of groups of size k−1 the updating modules 160 may communicate with the reference modules 170 to ground a vector of feedback signals $P_f(x_{0-(b-1),k-1})$ (i.e., the $k^{th}$ entry of each group). In one implementation, the reference modules 170 may effectively set the feedback signals $P_f(x)$ corresponding to the $k^{th}$ bit to zero. Thus, the feedback probability vectors $P_f$ may be generated based on these modified feedback signals $P_f(x)$.

The updating modules 160 may then generate updated probability vectors $P_{u,0}, P_{u,1}, \ldots, P_{u,b-1}$ (collectively referred to as updated probability vectors $P_u$). For example, the updating modules 160 may generate the updated probability vectors $P_u$ by summing the initial probability vectors $P_i$ with the corresponding feedback probability vectors $P_f$ ($P_u=P_i+P_f$).

The estimation modules 180 receive the updated probability vectors $P_u$. If the computation control module 150 is processing groups of k bits each, then the estimation modules 180 may not modify the updated probability vectors $P_u$. However, if the computation control module 150 is processing groups of less than k bits each (i.e., k−1, k−2), then the estimation modules 180 may communicate with the reference modules 170 to modify the updated probability vectors $P_u$.

For example, the reference modules 170 may ground half or more of the entries in each of the updated probability vectors $P_u$. If the computation control module 150 is processing groups of size k−1, the reference modules 170 may ground the last half of the entries of the updated probability vectors $P_u$. In one implementation, the reference modules 170 may zero the entries of the updated probability vectors $P_u$ corresponding to the $k^{th}$ bit being 1.

Grounding one or more vectors of feedback signals $P_f(x)$ and half or more entries of the updated probability vectors $P_u$ may result in the following:

$$P_u \atop a_i=1,a_k=1 (a_1^k) = 0,$$

$$P_u \atop a_i=0,a_k=1 (a_1^k) = 0,$$

$$P_u \atop a_i=1,a_k=0 (a_1^k) = P_u \atop a_i=1 (a_1^{k-1}),$$

$$P_u \atop a_i=0,a_k=0 (a_1^k) = P_u \atop a_i=0 (a_1^{k-1}).$$

Thus, the outputs of the estimation modules 180 are $P(x_i)=P_e(x_i)-P_f(x_i)$, where $P_e(x_i)$ may be generated as follows:

$$P_e(x_i) \approx \max\left(P_u \atop a_i=1 (a_1^{k-1})\right) - \max\left(P_u \atop a_i=0 (a_1^{k-1})\right).$$

Further support for decreasing group sizes (e.g., k−2, k−3, etc.) may be achieved by grounding additional vectors of the feedback signals $P_f(x)$ and additional updated probability vector $P_u$ entries corresponding to unused adders. In one implementation, each decrement of group size uses approximately half of the adders of a computation module.

Figure 7B:
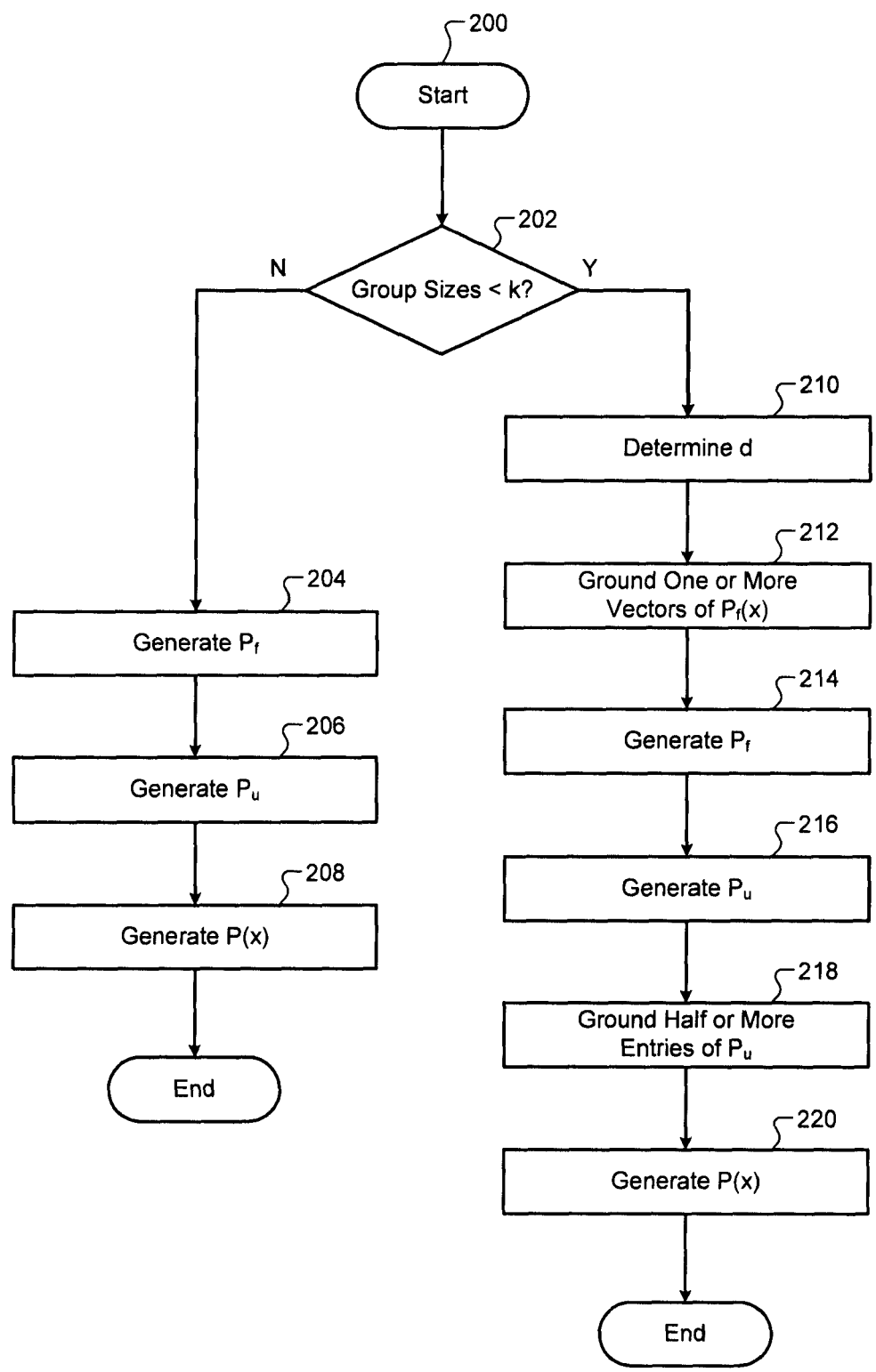
FIG. 7B is a flow diagram illustrating a method for operating the first embodiment of the parallel computation module according to the present disclosure.

Referring now to FIG. 7B, a flow diagram illustrating steps performed by the first embodiment of the computation control module 150 begins in step 200. In step 202, the computation control module 150 determines the sizes of the b groups being processed. If the size is k (i.e., the maximum), control proceeds to step 204. If the size is less than k, control proceeds to step 210.

In step 204, the computation control module 150 begins processing the b groups of k bits using an entire $2^k-1$ vector operations (i.e., all adders of the computation modules). The computation control module 150 generates the feedback probability vectors $P_f$ based on the feedback signals $P_f(X)$.

In step 206, the computation control module 150 generates the updated probability vectors $P_u$ based on the initial probability vectors $P_i$ and the feedback probability vectors $P_f$. In step 208, the computation control module 150 generates the bit estimations P(x) based on the updated probability vectors $P_u$ and control ends.

In step 210, the computation control module 150 determines the difference d between k and the number of bits in each of the b groups. In step 212, the computation control module 150 grounds one or more vectors of feedback signals $P_f(x)$ based on d. For example, if d=1 (i.e., group size k−1) then the computation control module 150 may ground the vector of feedback signals $P_f(x_{k-1})$ which corresponds to the $k^{th}$ bit for each of the b groups.

In step 214, the computation control module 150 generates the feedback probability vectors $P_f$ based on the modified feedback signals $P_f(x)$. In step 216, the computation control module 150 generates the updated probability vectors $P_u$ based on the initial probability vectors $P_i$ and the feedback probability vectors $P_f$.

In step 218, the computation control module 150 grounds half or more of the entries of the updated probability vectors $P_u$ based on d. For example, if d=1 (i.e., group size k−1), the computation control module 150 may ground the bottom (i.e., last) half of the entries of the updated probability vectors $P_u$ which correspond to the $k^{th}$ bit. In step 220, the computation control module 150 generates the bit estimations P(x) based on the updated probability vectors $P_u$, and control ends.

Figure 8A:
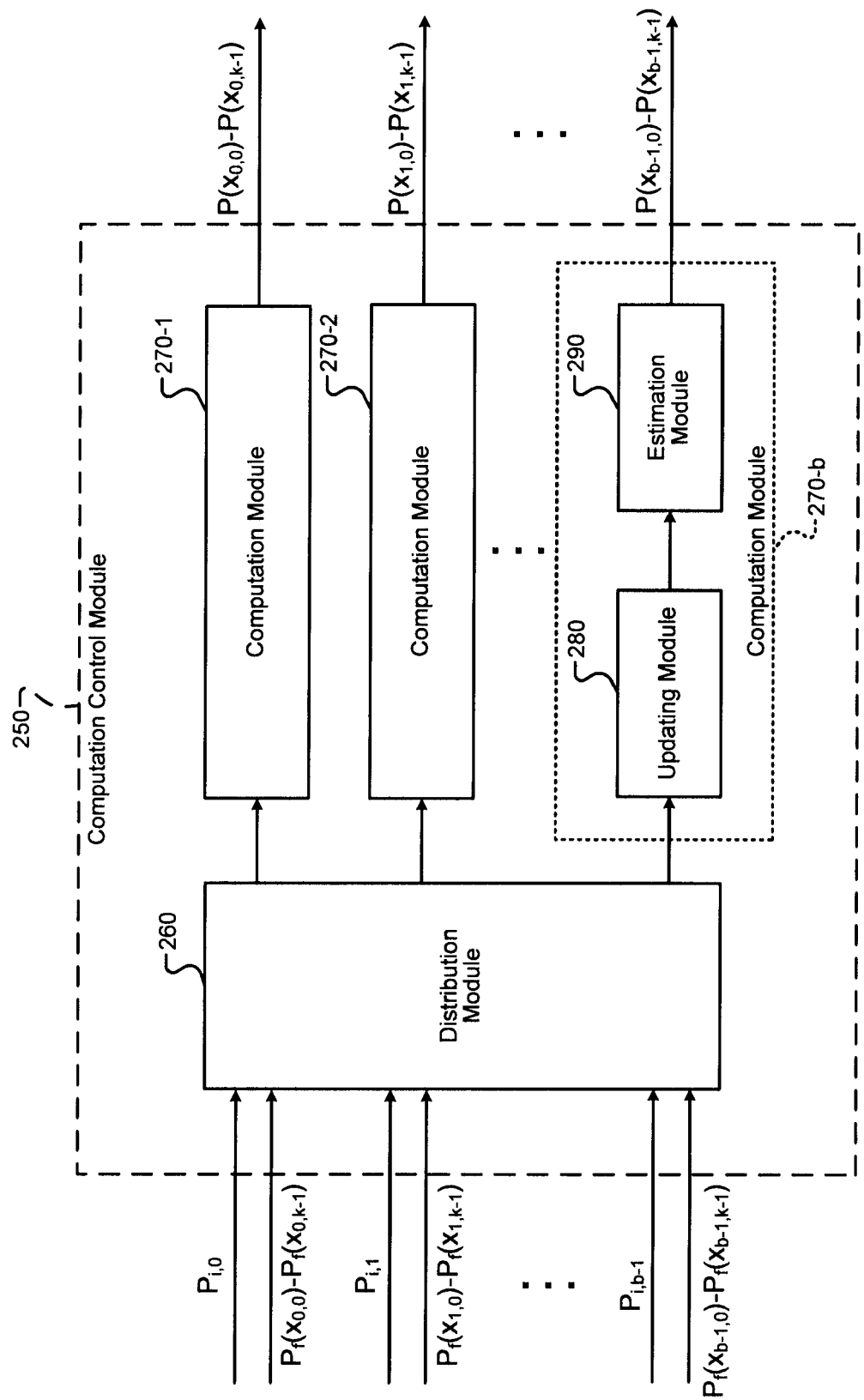
FIG. 8A is a functional block diagram of a second embodiment of the parallel computation module according to the present disclosure.

Referring now to FIG. 8A, a functional block diagram of a second embodiment of the computation control module 250 is shown. The computation control module 250 may reuse unused or idling adders for processing of multiple groups of less than k bits in size. Furthermore, computation control module 250 may disable unused computation modules in order to save power. For example, one computation module that may process k bits may also process two groups of k−1 bits by rerouting adders with multiplexers. Thus, the computation control module 250 may provide for constant adder utilization.

The computation control module 250 may include a distribution module 260. The computation control module 250 may also include b parallel computation modules 270-1, 270-2, ..., 270-b (collectively referred to as computation modules 270). Each of the computation modules 270 may include an updating module 280 and an estimation module 290. For example, each of the computation modules 270 may process up to k bits per cycle. Each of the computation modules 270 may also include multiplexers (not shown) to reroute adders for processing of multiple groups of less than k bits in size.

The distribution module 260 receives the b initial probability vectors $P_0, P_1, P_{b-1}$ (collectively referred to as initial probability vectors $P_i$). The distribution module 260 also receives the b×k feedback signals $P_f(x_{0,0}), P_f(x_{0,1}), \ldots, P_f(x_{b-1,k-1})$ (collectively referred to as feedback signals $P_f(x)$). The distribution module 260 may distribute the initial probability vectors $P_i$ and the corresponding feedback signals $P_f(x)$ to the computation modules 270 for processing.

However, if the computation control module 250 is processing groups of less than k bits (i.e., k−1, k−2, etc.), adders in each of the computation modules 270 may be rerouted using multiplexers and reused. In one implementation, the computation modules 270 may process more than one group of less than k bits in one cycle. The computation control module 250 may then disable any unused computation modules 270 after distributing the b groups in order to save power.

For example, two groups of k−1 bits may be processed using one of the computation modules 270. A feedback probability vector $P_f$ may be rearranged to illustrate the symmetry that allows for processing of two groups of k−1 bits:

$$P_f = P_f^{2^k-1} = \begin{bmatrix} P_f(x_0) \\ P_f(x_1) \\ P_f(x_1) + P_f(x_0) \\ P_f(x_2) \\ \vdots \\ P_f(x_{k-2}) + \ldots + P_f(x_1) + P_f(x_0) \\ P_f(x_{k-1}) \\ P_f(x_{k-1}) + P_f(x_0) \\ P_f(x_{k-1}) + P_f(x_1) + P_f(x_0) \\ P_f(x_{k-1}) + P_f(x2) \\ \vdots \\ P_f(x_{k-1}) + P_f(x_{k-2}) + \ldots + P_f(x_1) + P_f(x_0) \end{bmatrix} =$$

$$\begin{bmatrix} P_f^{2^{k-1}-1} \\ P_f(x_{k-1}) \\ \begin{bmatrix} P_f(x_{k-1}) \\ P_f(x_{k-1}) \\ \vdots \\ P_f(x_{k-1}) \end{bmatrix} + P_f^{2^{k-1}-1} \end{bmatrix},$$

$$P_f^{2^{k-1}-1} = \begin{bmatrix} P_f(x_0) \\ P_f(x_1) \\ P_f(x_1) + P_f(x_0) \\ P_f(x_2) \\ \vdots \\ P_f(x_{k-2}) + \ldots + P_f(x_1) + P_f(x_0) \end{bmatrix}.$$

An additional $2^k-1$ adders are required to evaluate:

$$\begin{bmatrix} P_f(x_{k-1}) \\ P_f(x_{k-1}) \\ \vdots \\ P_f(x_{k-1}) \end{bmatrix} + P_f^{2^{k-1}-1}.$$

In order for one of the computation modules 270 to process k−1 bits, a vector of feedback signals $P_f(x)$ corresponding to the $k^{th}$ bit may be grounded. This process was described previously in the first embodiment of the computation control module 150. Therefore, the $2^k-1$ adders no longer being used may be re-routed using multiplexers to evaluate another group of k−1 bits. In one implementation, a feedback probability vector $P_f$ may be generated as a combination of two groups of bits $b_0$ and $b_1$:

$$P_f = \begin{bmatrix} P_f^{2^{k-1}-1}{}_{,b0} \\ 0 \\ P_f^{2^{k-1}-1}{}_{,b1} \end{bmatrix}.$$

Thus, a corresponding initial probability vector $P_i$ may be rearranged for vector addition with $P_f$ in order to generate an updated probability vector $P_u$, thus reusing the $2^{k-1}$ adders that may be iding:

$$P_f = \begin{bmatrix} P_{i,k-1,b0} \\ 0 \\ P_{i,k-1,b1} \end{bmatrix}.$$

The rearrangement of data may result in partial terms being divided between the two groups $b_0$ and $b_1$ when evaluating the bit estimations P(x):

$$\max\left(P_u \atop a_j=1,a_k=0 (a_1^k)\right)\bigg|_k \rightarrow \max\left(P_u \atop a_j=1,b0 (a_1^{k-1})\right)\bigg|_{k-1}$$

$$\max\left(P_u \atop a_j=1,a_k=1 (a_1^k)\right)\bigg|_k \rightarrow \max\left(P_u \atop a_j=1,b1 (a_1^{k-1})\right)\bigg|_{k-1}$$

$$\max\left(P_u \atop a_j=0,a_k=0 (a_1^k)\right)\bigg|_k \rightarrow \max\left(P_u \atop a_j=0,b0 (a_1^{k-1})\right)\bigg|_{k-1}$$

$$\max\left(P_u \atop a_j=0,a_k=1 (a_1^k)\right)\bigg|_k \rightarrow \max\left(P_u \atop a_j=0,b1 (a_1^{k-1})\right)\bigg|_{k-1}.$$

Additionally, a comparator used to evaluate $\max[\max(P_{u0}, P_{u2})|_k - \max(P_{u4}, P_{u6})|_k]$ may be re-routed to evaluate $[\max(P_{u0}, P_{u2}) - \max(0, P_{u1})]|_{k-1}$. The same strategy may be applied for evaluating other bit estimations P(x) for both groups $b_0$ and $b_1$. The number of bits processed per cycle (i.e., the number of bit estimations P(x) generated) may approximately double for every integer decrement in group size. In other words, $b \times k|_k \sim 2b \times k-2b|_{k-1} \sim 4b \times k-8b|_{k-2}$.

Figure 8B:
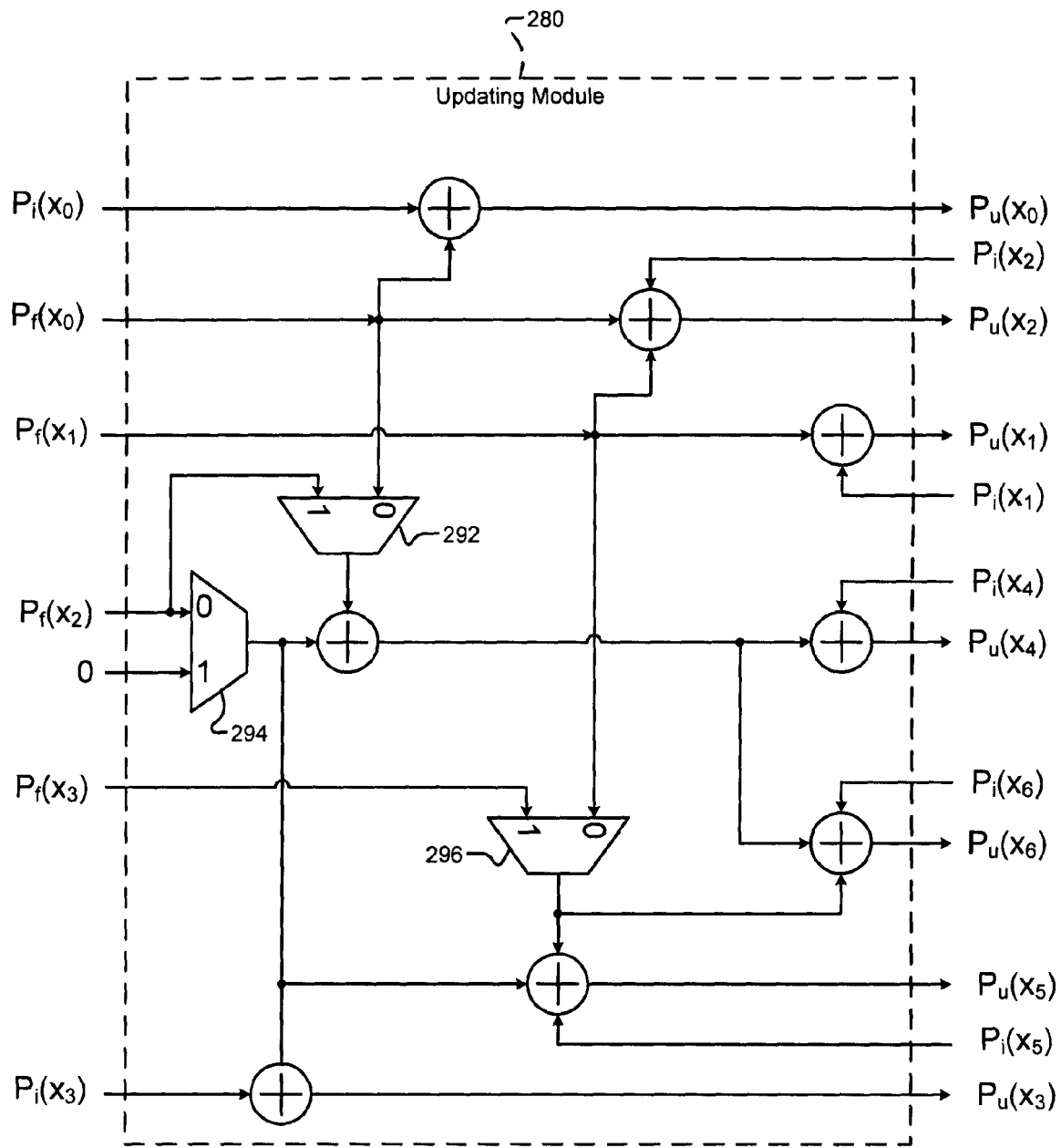
FIG. 8B is a schematic illustrating an exemplary computation performed by the second embodiment of the parallel computation module according to the present disclosure.

Referring now to FIG. 8B, an exemplary adder and multiplexer configuration of an updating module 280 (i.e., part of a computation module) that may process both k=3 bits and two sets of k−1=2 bits is shown. The updating module 280 may generate a feedback probability vector $P_f$ for either sized group. The multiplexers 292, 294, 296 enable and/or disable (i.e., reroute) adders based on whether one group of k=3 bits or two groups of k−1=2 bits are being processed.

For example, a low (e.g., 0) multiplexer control enables processing for one group of k=3 bits. The updating module 280 may set $P_f(x_{0,0})$ to $P_f(x_0)$, $P_f(x_{0,1})$ to $P_f(x_1)$, $P_f(x_{0,2})$ to $P_f(x_2)$, and thus may not use $P_f(x_{0,3})$:

$$P_{f,k=3} = P_f^{2^2-1} = \begin{bmatrix} P_f(x_0) \\ P_f(x_1) \\ P_f(x_1) + P_f(x_0) \\ P_f(x_2) \\ P_f(x_2) + P_f(x_0) \\ P_f(x_2) + P_f(x_1) \\ P_f(x_2) + P_f(x_1) + P_f(x_0) \end{bmatrix},$$

For example, a high (e.g., 1) multiplexer control enables processing for two groups of k−1=2 bits. Thus, the updating module 280 effectively sets the following inputs:

$$P_f(x_0) = P_f(x_{0,b0}) \quad P_i(x_0) = P_{i0,b0}$$
$$P_f(x_1) = P_f(x_{1,b0}) \quad P_i(x_1) = P_{i1,b0}$$
$$P_f(x_2) = P_f(x_{0,b1}) \quad P_i(x_2) = P_{i2,b0}$$
$$P_f(x_3) = P_f(x_{0,b1}), \quad P_i(x_3) = 0$$
$$P_i(x_4) = P_{i0,b1}$$
$$P_i(x_5) = P_{i1,b1}$$
$$P_i(x_6) = P_{i2,b1}.$$

Therefore, the updating module 280 may rearrange initial probability vector $P_i$ and feedback probability vector $P_f$ for vector addition to generate $P_u$ for two groups of k−1=2 bits:

$$P_{f,k-1=2,b0,b1} = \begin{bmatrix} P_{f,k-1=2,b0} \\ 0 \\ P_{f,k-1=2,b1} \end{bmatrix} = \begin{bmatrix} P_f(x_{0,b0}) \\ P_f(x_{1,b0}) \\ P_f(x_{1,b0}) + P_f(x_{0,b0}) \\ 0 \\ P_f(x_{0,b1}) \\ P_f(x_{1,b1}) \\ P_f(x_{1,b1}) + P_f(x_{0,b1}) \end{bmatrix},$$

$$P_{u,k-1=2,b0,b1} =$$

$$P_{f,k-1=2,b0,b1} + P_{i,k-1=2,b0,b1} = \begin{bmatrix} P_f(x_{0,b0}) \\ P_f(x_{1,b0}) \\ P_f(x_{1,b0}) + P_f(x_{0,b0}) \\ 0 \\ P_f(x_{0,b1}) \\ P_f(x_{1,b1}) \\ P_f(x_{1,b1}) + P_f(x_{0,b1}) \end{bmatrix} + \begin{bmatrix} P_{i0,b0} \\ P_{i1,b0} \\ P_{i2,b0} \\ 0 \\ P_{i0,b1} \\ P_{i1,b1} \\ P_{i2,b1} \end{bmatrix}.$$

Figure 8C:
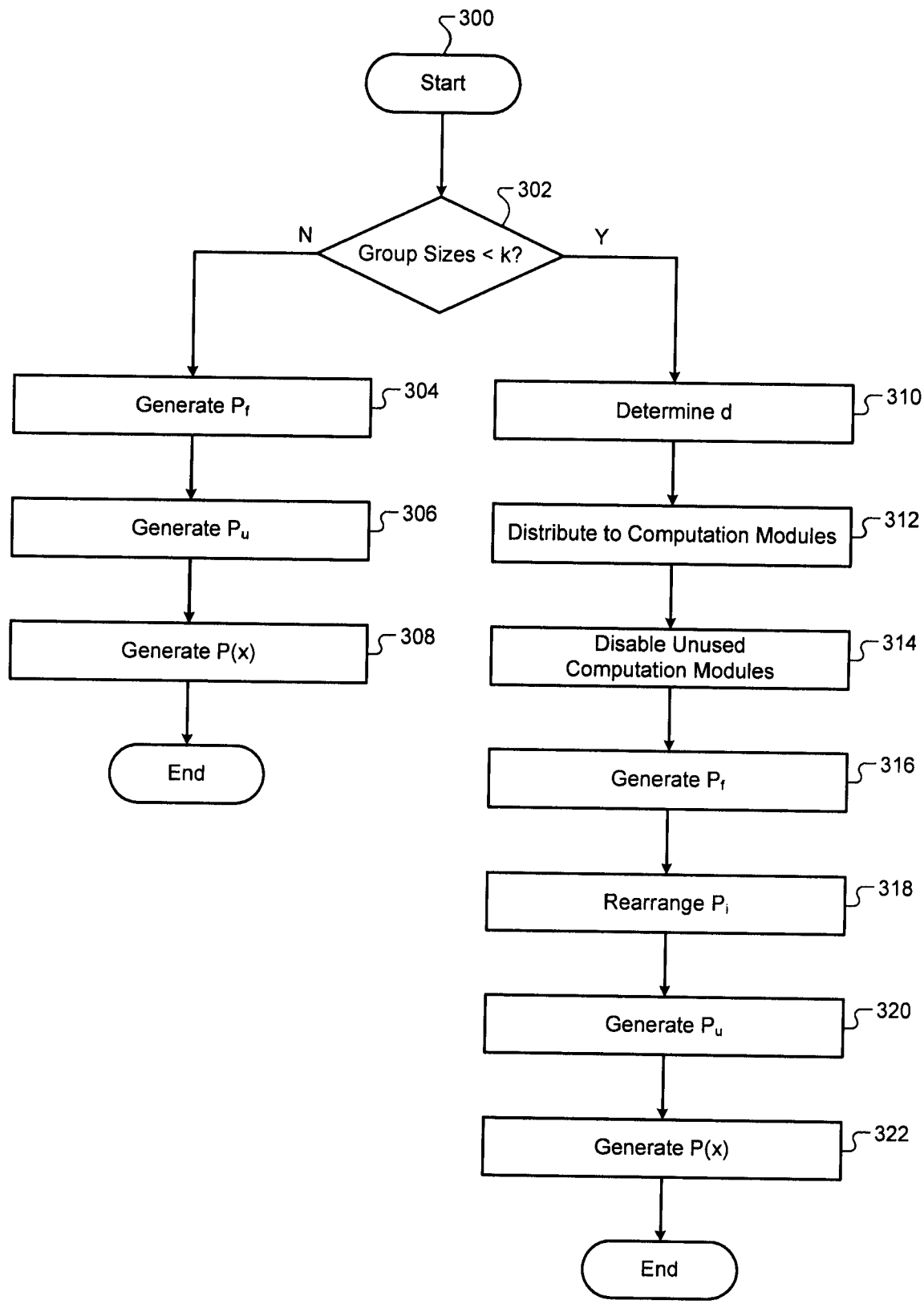
FIG. 8C is a flow diagram illustrating a method for operating the second embodiment of the parallel computation module according to the present disclosure.

Referring now to FIG. 8C, a flow diagram illustrating steps performed by the second embodiment of the computation control module 250 begins in step 300. In step 302, the computation control module 250 determines the size of the b groups being processed. If the size is the maximum size k, control proceeds to step 304. If the size is less than k, control proceeds to step 310.

In step 304, the computation control module 250 begins processing the b groups of k bits using an entire $2^k-1$ vector operations (i.e., all adders of the computation modules). The computation control module 250 generates the feedback probability vectors $P_f$ based on the feedback signals $P_f(X)$.

In step 306, the computation control module 250 generates the updated probability vectors $P_u$ based on the initial probability vectors $P_i$ and the feedback probability vectors $P_f$. In step 308, the computation control module 250 generates the bit estimations P(x) based on the updated probability vectors $P_u$ and control ends.

In step 310, the computation control module 250 determines the difference d between k and the number of bits in each of the b groups. In step 312, the computation control module 250 distributes the b groups to the computation modules for processing based on d. For example, if d=1 (i.e., group size k−1) then the computation control module 250 may distribute two k−1 groups each one computation module to be processed concurrently.

In step 314, the computation control module 250 disables any unused computation modules. For example, disabling unused computation modules may save power. In step 316, the computation control module 250 generates the feedback probability vectors $P_f$ based on the feedback signals $P_f(X)$.

In step 318, the computation control module 250 generates the updated probability vectors $P_u$ based on the initial probability vectors $P_i$ and the feedback probability vectors $P_f$. In step 320, the computation control module 250 generates the bit estimations $P(x)$ based on the updated probability vectors $P_u$, and control ends.

Figure 9A:
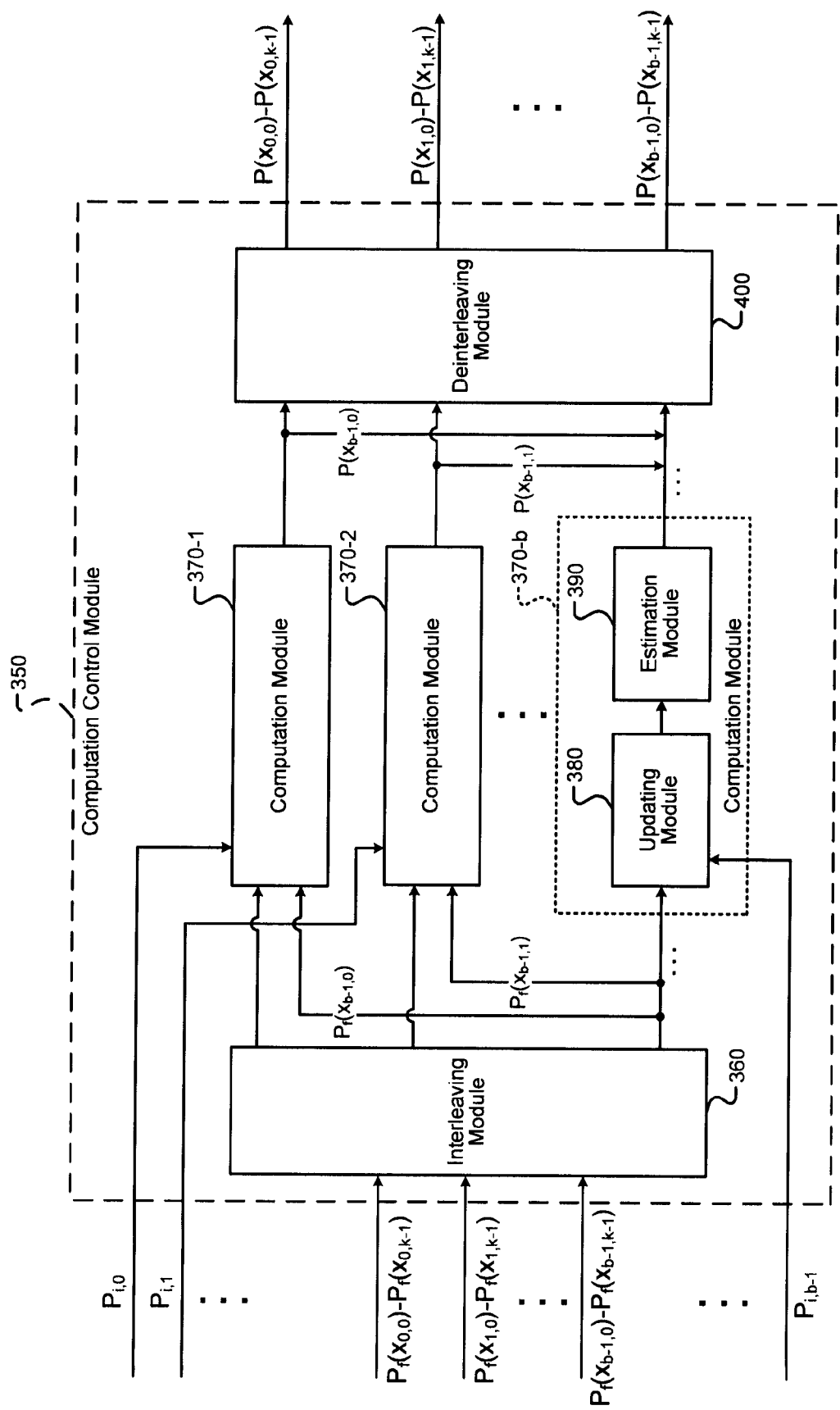
FIG. 9A is a functional block diagram of a third embodiment of the parallel computation module according to the present disclosure.

Referring now to FIG. 9A, a functional block diagram of a third embodiment of the computation control module 350 is shown. The computation control module 350 may interleave and redistribute bits for processing to different computation modules based on the group sizes being processed. Furthermore, the computation control module 350 may disable unused computation modules in order to save power. Thus, the computation control module 350 may provide for a constant number of bits to be processed per cycle (i.e., a constant bit-throughput).

The computation control module 350 may include an interleaving module 360. The computation control module 350 may also include b parallel computation modules 370-1, 370-2, ..., 370-b (collectively referred to as computation modules 370). For example, each of the computation modules 370 may include an updating module 380 and an estimation module 390. The computation control module 350 may further include a deinterleaving module 400.

To achieve a constant bit-throughput and/or to use the same interleaving module 360 and deinterleaving module 400 to support of both k and k−1 bits, a constraint may be necessary:

$$b_k \times k = 2 \times b_{k-1} \times (k-1).$$

$b_k$ represents a number of computation modules 370 processing b groups of k bits each. $b_{k-1}$ represents a number of computation modules 370 processing b groups of k−1 bits each. k is the maximum numbers of bits that may be processed by each of the computation modules 370 per cycle.

For example, four computation modules 370 may be used to process three bits each ($b_k$=4, k=3) and the three of those four computation modules 370 may be used to process two groups of two bits each ($b_{k-1}$=3). In other words, 4×3=2×3×2 (i.e., 12=12), and the constraint is satisfied.

The interleaving module 360 may receive feedback signals $P_f(x_{0,0})$, $P_f(x_{0,1})$, ..., $P_f(x_{b-1,k-1})$ (collectively referred to as feedback signals $P_f(x)$) corresponding to each of the k bits in each of the b groups. The interleaving module 360 may perform interleaving on the received data $P_f(x)$. Interleaving is a process of rearranging the bits of a signal that may be used to improve error correction.

For example, errors that occur in a transmission may tend to be focused over a span of a few bits and therefore may be referred to as a burst error. Thus, by interleaving the received signal, there may be a higher probability that all the incorrect bits may be corrected, as compared to a probability of consecutive incorrect bits being corrected.

In one implementation, the interleaving module 360 may rearrange the received data and may output the data in a non-linear way. For example, the interleaver may receive $P_f(x_{0,0})$, $P_f(x_{0,1})$, $P_f(x_{0,2})$ and output $P_f(x_{0,2})$, $P_f(x_{0,0})$, and $P_f(x_{0,1})$, in those orders. Therefore, if bits 2 and 3 ($x_{0,1}$ and $x_{0,2}$, respectively) are incorrect, there may be a higher probability of correcting the bits because the bits are no longer grouped together (e.g., consecutively).

The interleaving module 360 may output the feedback signals $P_f(x)$ after interleaving. However, if the computation control module 350 is processing groups of less than k bits in size, the interleaving module 360 may re-route some feedback signals $P_f(x)$ to other computation modules 370. In one implementation, if a computation module 370 is processing two groups of k−1 bits, the corresponding feedback signals $P_f(x)$ for that second group of k−1 bits may be rerouted. After re-routing data, any computation modules 370 that are not being used may be disabled. For example, disabling unused computation modules 370 may save power.

The computation modules 370 generate bit estimations $P(x)$ based on the b groups of bits as shown in previous implementations. The computation control module 350 may reroute the bit estimations $P(x)$ before deinterleaving. The deinterleaving module 400 receives the bit estimations $P(x)$. The deinterleaving module 400 may output the bit estimations $P(x)$ in a correct linear sequence (i.e., in order) after deinterleaving. Deinterleaving is an inverse process of interleaving. In one implementation, the deinterleaving module 400 may receive $P(x_{0,2})$, $P(x_{0,0})$, $P(x_{0,1})$ and output $P(x_{0,0})$, $P(x_{0,1})$, $P(x_{0,2})$, in those orders.

Figure 9B:
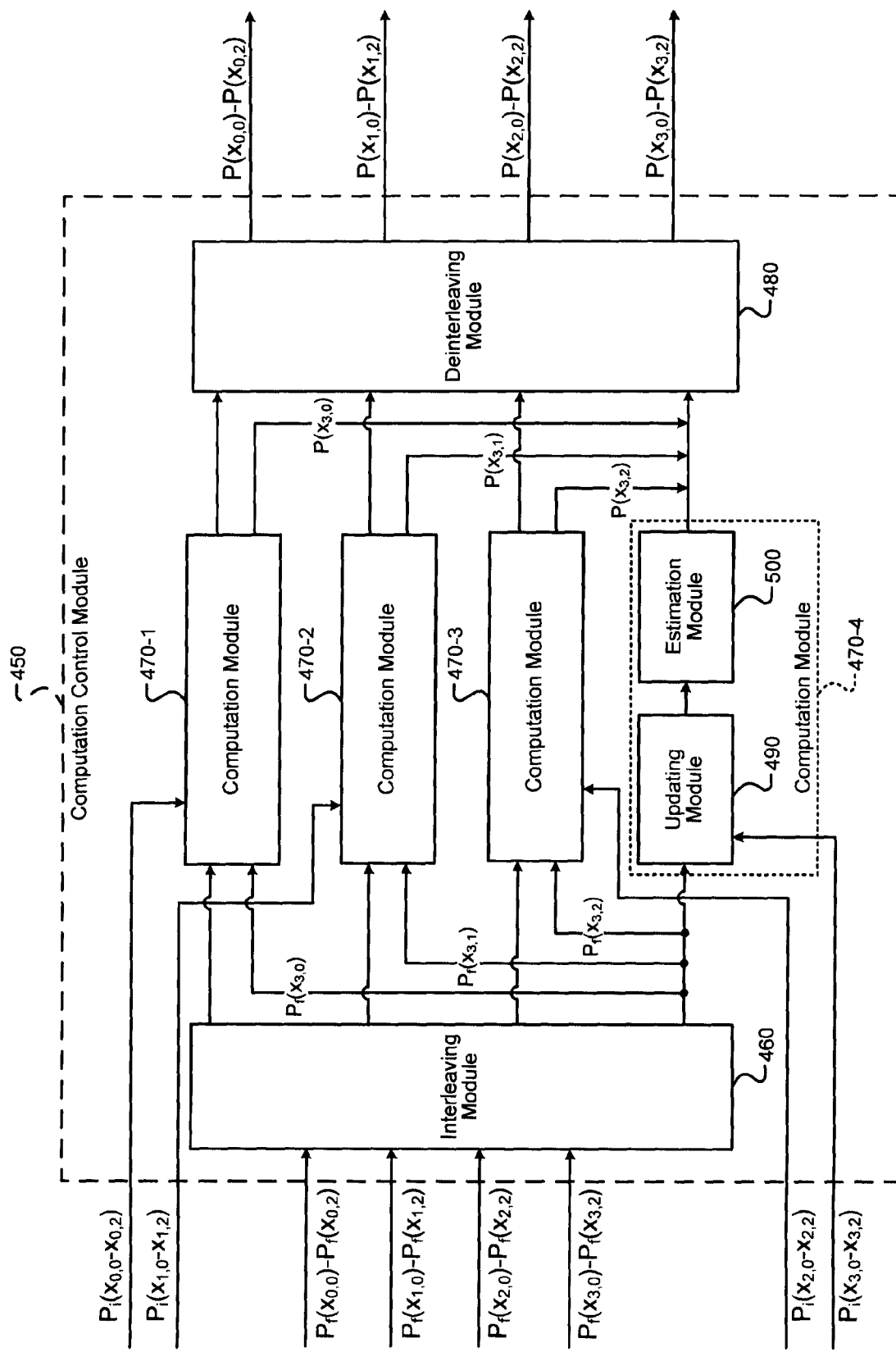
FIG. 9B is a functional block diagram of an exemplary third embodiment of the parallel computation module according to the present disclosure.

Referring now to FIG. 9B, an exemplary configuration of the third embodiment of the computation control module 450 is shown. The computation control module 450 includes an interleaving module 460, four computation modules 470-1, 470-2, 470-3, 470-4 (collectively referred to as computation modules 470), and a deinterleaving module 480. For example, each computation module 470 may include an updating module 490 and an estimation module 500.

In one implementation, the computation control module 450 may achieve a constant 12 bit-throughput. In other words, the computation control module 450 may process 12 bits per cycle. For example, the computation control module may process correlated bit groups of size k=3 and k−1=2.

If the computation control module 450 is processing groups of size k=3, each of the computation modules 470 may process a full k bits each. However, if the computation control module 450 is processing groups of size k−1 (i.e., k−1=2), computation modules 470-1, 470-2, and 470-3 may each process two groups of two bits each.

The computation control module 450 may then disable computation module 470-4. For example, disabling computation module 470-4 may save power. However, the computation control module 450 may re-route the feedback signals $P_f(x)$ from computation module 470-4 to computation modules 470-1, 470-2, 470-3 that are now processing the corresponding bit(s).

The computation modules 470-1, 470-2, and 470-3 generate the bit estimations $P(x)$. The computation control module 450 may reroute the bit estimations $P(x)$ before deinterleaving. The deinterleaving module 480 receives the bit estimations $P(x)$ and deinterleaves them to output the correct bit estimations $P(x)$ (i.e., in order).

Figure 9C:
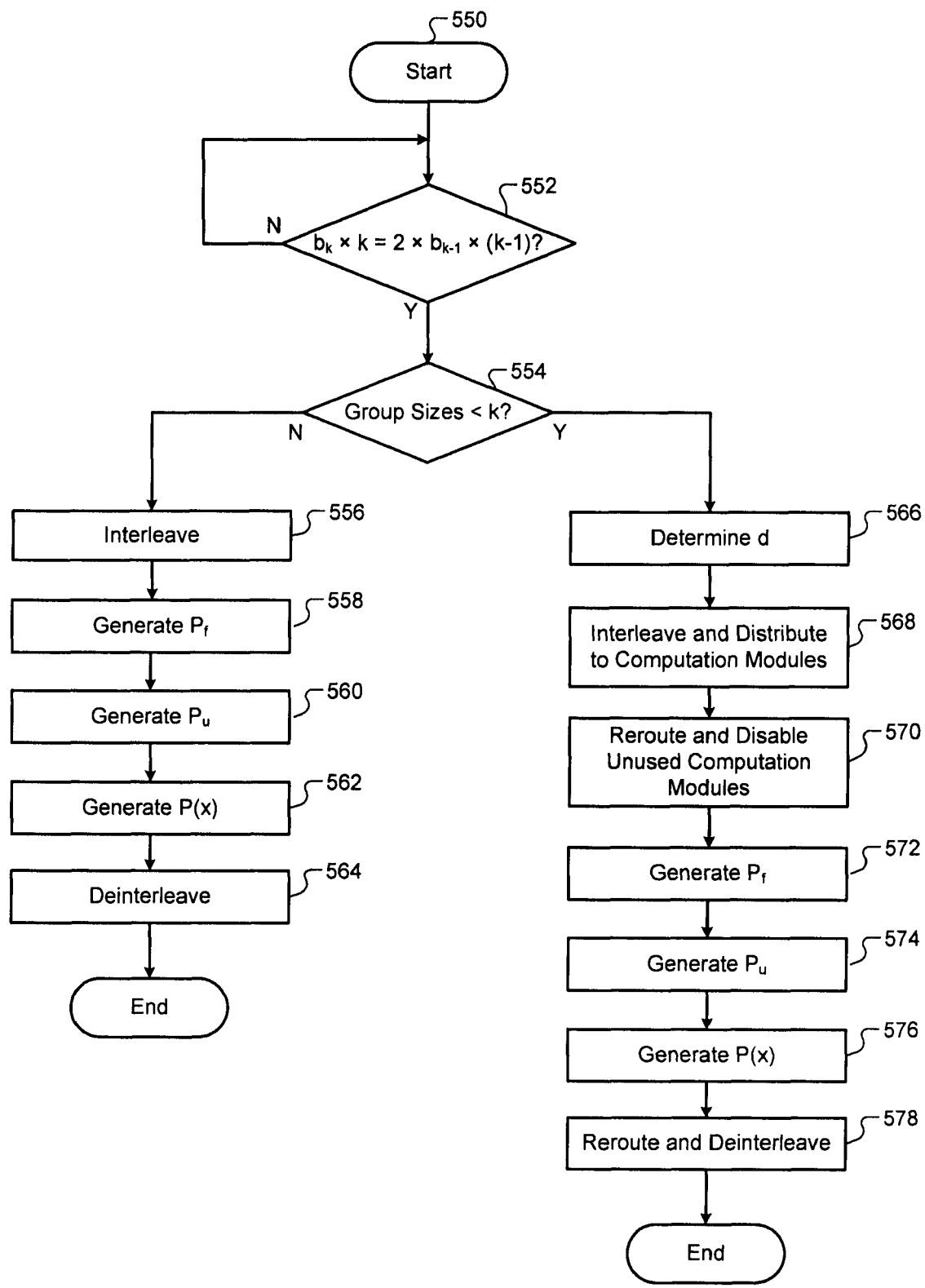
FIG. 9C is a flow diagram illustrating a method for operating the third embodiment of the parallel computation module according to the present disclosure.

Referring now to FIG. 9C, a flow diagram illustrating steps performed by the third embodiment of the computation control module 350 begins in step 550. In step 552, the computation control module 350 determines whether the constraint has been satisfied. If yes, control proceeds to step 554. If no, control returns to step 552.

In step 554, the computation control module 350 determines the sizes of the b groups being processed. If the size is the maximum size k, control proceeds to step 556. If the size is less than k, control proceeds to step 566.

In step 556, the computation control module 350 deinterleaves the feedback signals $P_f(x)$. In step 558, the computation control module 350 begins processing the b groups of k bits using an entire $2^k-1$ vector operations (i.e., all adders of the computation modules). The computation control module 350 generates the feedback probability vectors $P_f$ based on the feedback signals $P_f(x)$.

In step 560, the computation control module 350 generates the updated probability vectors $P_u$ based on the initial probability vectors $P_i$ and the feedback probability vectors $P_f$. In step 562, the computation control module 350 generates the bit estimations P(x) based on the updated probability vectors $P_u$. In step 564, the computation control module 350 deinterleaves the bit estimations P(x) and control ends.

In step 566, the computation control module 350 determines the difference d between k and the number of bits in each of the b groups. In step 568, the computation control module 350 interleaves the feedback signals $P_f(x)$ and distributes the b groups to the computation modules for processing based on d. For example, if d=1 (i.e., group size k−1) then the computation control module 350 may distribute two k−1 groups to each computation module to be processed concurrently.

In step 570, the computation control module 350 reroutes feedback signals $P_f(x)$ from unused computation modules to the computation modules processing the corresponding bit(s). The computation control module 350 also disables any unused computation modules. For example, disabling unused computation modules may save power.

In step 572, the computation control module 350 generates the feedback probability vectors $P_f$ based on the feedback signals $P_f(x)$. In step 574, the computation control module 350 generates the updated probability vectors $P_u$ based on the initial probability vectors $P_i$ and the feedback probability vectors $P_f$. In step 576, the computation control module 350 generates the bit estimations P(x) based on the updated probability vectors $P_u$. In step 578, the computation control module 350 reroutes the bit estimations P(x) to the correct inputs of the deinterleaving module 480. The computation control module 350 then deinterleaves the bit estimations P(x) and control ends.

The broad teachings of the disclosure can be implemented in a variety of forms. Therefore, while this disclosure includes particular examples, the true scope of the disclosure should not be so limited since other modifications will become apparent upon a study of the drawings, the specification, and the following claims.

What is claimed is:

1. A communication system, comprising:
   an encoder configured to encode first data words to generate code words;
   a modulator configured to modulate the code words into a first signal that is transmitted on a communication channel;
   a demodulator configured to demodulate a second signal, received from the communication channel, into estimates of the code words, wherein the second signal is based on the first signal; and
   a decoding module configured to i) group the estimates of the code words into a plurality of groups of correlated data bits, wherein the correlated data bits include statistical relationships between different data bits, ii) generate a plurality of group estimate signals each corresponding to a respective one of the plurality of groups of correlated data bits, and iii) generate, by combining the plurality of group estimate signals, an estimate signal corresponding to the first data words.

2. The communication system of claim 1, wherein the second signal corresponds to the first signal corrupted by noise or interference.

3. The communication system of claim 1, wherein the decoding module is configured to generate the plurality of group estimate signals by decoding the plurality of groups of correlated data bits.

4. The communication system of claim 1, wherein the decoding module is configured to generate the plurality of group estimate signals by generating soft decoding information based on the plurality of groups of correlated data bits.

5. The communication system of claim 4, wherein the soft decoding information includes log likelihood ratios.

6. The communication system of claim 1, wherein the decoding module is configured to generate the plurality of group estimate signals by generating a plurality of probability vectors corresponding to respective ones of the plurality of groups of correlated data bits, wherein the plurality of probability vectors includes probabilities that each of the correlated data bits has a respective value.

7. The communication system of claim 1, wherein the decoding module is configured to generate the plurality of group estimate signals by decoding two or more of the plurality of groups of correlated data bits concurrently.

8. The communication system of claim 1, wherein one or more of the plurality of groups of correlated data bits has a different size than others of the plurality of groups of correlated data bits.

9. A method of operating a communication system, the method comprising:
   encoding first data words to generate code words;
   modulating the code words into a first signal that is transmitted on a communication channel;
   demodulating a second signal, received from the communication channel, into estimates of the code words, wherein the second signal is based on the first signal;
   grouping the estimates of the code words into a plurality of groups of correlated data bits, wherein the correlated data bits include statistical relationships between different data bits;
   generating a plurality of group estimate signals each corresponding to a respective one of the plurality of groups of correlated data bits; and
   generating, by combining the plurality of group estimate signals, an estimate signal corresponding to the first data words.

10. The method of claim 9, wherein the second signal corresponds to the first signal corrupted by noise or interference.

11. The method of claim 9, further comprising generating the plurality of group estimate signals by decoding the plurality of groups of correlated data bits.

12. The method of claim 9, further comprising generating the plurality of group estimate signals by generating soft decoding information based on the plurality of groups of correlated data bits.

13. The method of claim 12, wherein the soft decoding information includes log likelihood ratios.

14. The method of claim 9, further comprising generating the plurality of group estimate signals by generating a plurality of probability vectors corresponding to respective ones of the plurality of groups of correlated data bits, wherein the plurality of probability vectors includes probabilities that each of the correlated data bits has a respective value.

15. The method of claim 9, further comprising generating the plurality of group estimate signals by decoding two or more of the plurality of groups of correlated data bits concurrently.

16. The method of claim 9, wherein one or more of the plurality of groups of correlated data bits has a different size than others of the plurality of groups of correlated data bits.

* * * * *